United States Patent
Hasegawa et al.

(10) Patent No.: US 12,327,938 B2
(45) Date of Patent: Jun. 10, 2025

(54) ELECTRONIC MODULE, INTERMEDIATE CONNECTION MEMBER, AND ELECTRONIC DEVICE

(71) Applicant: CANON KABUSHIKI KAISHA, Tokyo (JP)

(72) Inventors: Mitsutoshi Hasegawa, Kanagawa (JP); Noritake Tsuboi, Kanagawa (JP); Satoru Higuchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 370 days.

(21) Appl. No.: 18/148,443

(22) Filed: Dec. 30, 2022

(65) Prior Publication Data
US 2023/0223713 A1    Jul. 13, 2023

(30) Foreign Application Priority Data
Jan. 13, 2022    (JP) ................... 2022-003467

(51) Int. Cl.
*H01R 12/52* (2011.01)
*H05K 1/11* (2006.01)
(Continued)

(52) U.S. Cl.
CPC ............ *H01R 12/52* (2013.01); *H05K 1/111* (2013.01); *H05K 3/3442* (2013.01); *H05K 3/368* (2013.01);
(Continued)

(58) Field of Classification Search
CPC .......... H01R 12/52; H01R 4/02; H05K 1/111; H05K 3/3442; H05K 3/368; H05K 1/144;
(Continued)

(56) References Cited

U.S. PATENT DOCUMENTS 4,533,976 A * 8/1985 Suwa ............. G11C 5/00
    361/679.02
6,183,272 B1 * 2/2001 Muller ............. H05K 3/325
    439/91
(Continued)

FOREIGN PATENT DOCUMENTS

JP    H08-88062 A    4/1996
JP    2001-102746 A    4/2001
(Continued)

OTHER PUBLICATIONS

U.S. Appl. No. 18/159,097, filed Jan. 25, 2023 by Yuya Okada.

*Primary Examiner* — Anthony M Haughton
*Assistant Examiner* — Theron S Milliser
(74) *Attorney, Agent, or Firm* — VENABLE LLP

(57) ABSTRACT

An electronic module includes a first wiring board, a second wiring board, and an intermediate connection member. The intermediate connection member includes an insulator, a plurality of first wirings supported by the insulator and arranged at intervals in a second direction intersecting a first direction, a plurality of second wirings supported by the insulator and arranged at intervals in the second direction, and a metal layer supported by the insulator and interposed between the plurality of first wirings and the plurality of second wirings so as to oppose the plurality of first wirings and the plurality of second wirings in a third direction intersecting the first direction and the second direction. A part of the metal layer sandwiched in the insulator is bonded to one of the first wiring board or the second wiring board by a conductive first bonding member.

20 Claims, 9 Drawing Sheets

(51) Int. Cl.
*H05K 1/18* (2006.01)
*H05K 3/34* (2006.01)
*H05K 3/36* (2006.01)
*H01R 4/02* (2006.01)
*H05K 1/14* (2006.01)
*H10B 80/00* (2023.01)

(52) U.S. Cl.
CPC ............... *H01R 4/02* (2013.01); *H05K 1/144* (2013.01); *H05K 1/181* (2013.01); *H05K 2201/042* (2013.01); *H05K 2201/049* (2013.01); *H05K 2201/094* (2013.01); *H05K 2201/09409* (2013.01); *H05K 2201/09445* (2013.01); *H05K 2201/10159* (2013.01); *H05K 2201/10378* (2013.01); *H10B 80/00* (2023.02)

(58) Field of Classification Search
CPC ............. H05K 1/181; H05K 2201/042; H05K 2201/049; H05K 2201/094; H05K 2201/09409; H05K 2201/09445; H05K 2201/10159; H05K 2201/10378; H05K 1/113; H05K 1/148; H05K 3/361; H10B 80/00
See application file for complete search history.

(56) References Cited

U.S. PATENT DOCUMENTS

| | | | |
|---|---|---|---|
| 7,876,573 B2* | 1/2011 | Motohara | H05K 1/144 361/803 |
| 8,144,482 B2* | 3/2012 | Sato | H05K 1/144 361/810 |
| 8,159,829 B2* | 4/2012 | Mori | H01R 13/6586 361/767 |
| 8,842,443 B2* | 9/2014 | Lim | H05K 1/141 361/814 |
| 9,421,628 B2 | 8/2016 | Higuchi | |
| 9,781,828 B2* | 10/2017 | Yamamoto | H05K 3/0097 |
| 11,412,616 B2 | 8/2022 | Tsuboi | |
| 11,452,201 B2* | 9/2022 | Hirano | H05K 1/144 |
| 11,595,557 B2 | 2/2023 | Okada | |
| 11,950,364 B2* | 4/2024 | Hasegawa | H05K 1/144 |
| 12,211,879 B2* | 1/2025 | Hasegawa | H10F 39/011 |
| 2005/0168961 A1* | 8/2005 | Ono | H01L 25/0652 257/E25.011 |
| 2007/0279890 A1* | 12/2007 | Motohara | H05K 1/144 361/810 |
| 2009/0135573 A1* | 5/2009 | Sato | H05K 1/144 29/830 |
| 2009/0321122 A1* | 12/2009 | Mori | H01R 13/6586 29/852 |
| 2012/0243195 A1* | 9/2012 | Lim | H05K 1/141 361/784 |
| 2020/0113056 A1 | 4/2020 | Hasegawa | |
| 2021/0320142 A1 | 10/2021 | Noguchi | |
| 2021/0392740 A1* | 12/2021 | Hirano | H05K 7/14 |
| 2022/0020807 A1* | 1/2022 | Hasegawa | H10F 39/809 |
| 2022/0167504 A1* | 5/2022 | Hasegawa | H05K 1/144 |
| 2022/0319737 A1* | 10/2022 | Hasegawa | H05K 1/145 |
| 2022/0346219 A1 | 10/2022 | Hasegawa | |
| 2022/0353995 A1* | 11/2022 | Tsuboi | H05K 3/3452 |
| 2023/0223713 A1* | 7/2023 | Hasegawa | H05K 1/111 361/796 |
| 2024/0407098 A1* | 12/2024 | Hasegawa | H01L 25/07 |

FOREIGN PATENT DOCUMENTS

| | | |
|---|---|---|
| JP | 2001-111232 A | 4/2001 |
| JP | 2006-286660 A | 10/2006 |

* cited by examiner

ELECTRONIC MODULE, INTERMEDIATE CONNECTION MEMBER, AND ELECTRONIC DEVICE

BACKGROUND OF THE INVENTION

Field of the Invention

The present disclosure relates to a technique of laminating a first wiring board and a second wiring board.

Description of the Related Art

An electronic device including an electronic module including a plurality of wiring boards is known. Due to the demand for miniaturization of the electronic device, demand for high-density integration of the electronic module has been increasing. As one of structures that realize the high-density integration, a three-dimensional integration structure constituted by laminating a plurality of wiring boards into multiple layers is known. For the three-dimensional integration structure, a method of interconnecting two wiring boards opposing each other by using solder balls and a method of interconnecting the two wiring boards by using an intermediate connection member including wiring is known. Japanese Patent Laid-Open No. 2001-111232 discloses a three-dimensional integration structure constituted by interconnecting two mounting boards by an intermediate connection member.

In recent years, due to demand for further miniaturization of the electronic device, demand for further miniaturization of the electronic module, that is, further miniaturization the intermediate connection member has been also increasing. Since the distance between wirings in the intermediate connection member is reduced by the miniaturization of the intermediate connection member, it is desired that a noise generated in the wiring in the intermediate connection member is reduced.

SUMMARY OF THE INVENTION

According to a first aspect of the present invention, an electronic module includes a first wiring board, a second wiring board disposed with a gap from the first wiring board in a first direction, and an intermediate connection member interposed between the first wiring board and the second wiring board. The intermediate connection member includes an insulator, a plurality of first wirings supported by the insulator and arranged at intervals in a second direction intersecting the first direction, a plurality of second wirings supported by the insulator and arranged at intervals in the second direction, and a metal layer supported by the insulator and interposed between the plurality of first wirings and the plurality of second wirings so as to oppose the plurality of first wirings and the plurality of second wirings in a third direction intersecting the first direction and the second direction. A part of the metal layer sandwiched in the insulator is bonded to one of the first wiring board or the second wiring board by a conductive first bonding member.

According to a second aspect of the present invention, an electronic module includes a first wiring board, a second wiring board disposed with a gap from the first wiring board in a first direction, and an intermediate connection member interposed between the first wiring board and the second wiring board. The intermediate connection member includes an insulator a plurality of first wirings supported by the insulator and arranged at intervals in a second direction intersecting the first direction, a plurality of second wirings supported by the insulator and arranged at intervals in the second direction, and a metal layer supported by the insulator and interposed between the plurality of first wirings and the plurality of second wirings so as to oppose the plurality of first wirings and the plurality of second wirings in a third direction intersecting the first direction and the second direction. The plurality of first wirings and the plurality of second wirings include a signal wiring used for signal transmission. A distance between the signal wiring and the metal layer is equal to or smaller than a distance between two closest wirings in the plurality of first wirings and the plurality of second wirings.

According to a third aspect of the present invention, an intermediate connection member interposed between a first wiring board and a second wiring board such that the first wiring board and the second wiring board are spaced apart from each other in a first direction, the intermediate connection member includes an insulator, a plurality of first wirings supported by the insulator and arranged at intervals in a second direction intersecting the first direction, a plurality of second wirings supported by the insulator and arranged at intervals in the second direction, and a metal layer supported by the insulator and interposed between the plurality of first wirings and the plurality of second wirings so as to oppose the plurality of first wirings and the plurality of second wirings in a third direction intersecting the first direction and the second direction. The metal layer has an end surface exposed from the insulator in a surface of the intermediate connection member opposing one of the first wiring board or the second wiring board.

Further features of the present invention will become apparent from the following description of exemplary embodiments with reference to the attached drawings.

DESCRIPTION OF THE EMBODIMENTS

Exemplary embodiments of the present disclosure will be described in detail below with reference to drawings.

First Embodiment

Figure 1:
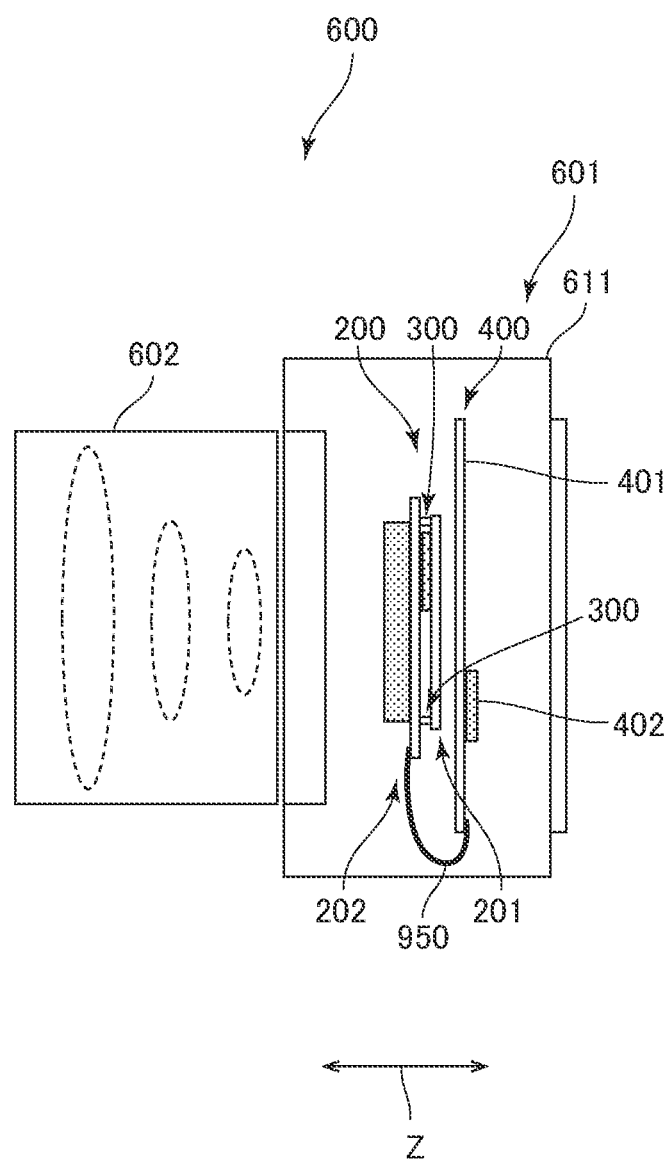
FIG. 1 is an explanatory diagram of a digital camera that is an image pickup apparatus serving as an example of an electronic device according to a first embodiment.

FIG. 1 is an explanatory diagram of a digital camera 600 that is an image pickup apparatus serving as an example of an electronic device according to a first embodiment. The digital camera 600 is a digital camera of a lens-replacing type, and includes a camera body 601. A lens unit 602 including a lens is attachable to and detachable from the camera body 601. The lens unit 602 is a replacing lens, that is, a lens barrel.

The camera body 601 includes a casing 611, and an image pickup module 200 and an image processing module 400 that are disposed inside the casing 611. The image pickup module 200 and the image processing module 400 are communicably and electrically interconnected via a flexible printed wiring board 950. A signal representing image data generated by the image pickup module 200 is transmitted to the image processing module 400 via the flexible printed wiring board 950. The signal representing the image data is a digital signal.

The image pickup module 200 is an example of an electronic module, and has a three-dimensional integration structure. The image pickup module 200 includes circuit units 201 and 202, and a plurality of intermediate connection members 300 serving as an example of at least one intermediate connection member. The circuit unit 201 is an example of a first circuit unit, and the circuit unit 202 is an example of a second circuit unit.

The image processing module 400 includes a printed wiring board 401, and an image processing device 402 that is a semiconductor element mounted on the printed wiring board 401. The image processing device 402 is, for example, a digital signal processor. The image processing device 402 is configured to perform image processing on image data obtained from the image pickup module 200.

Figure 2A:
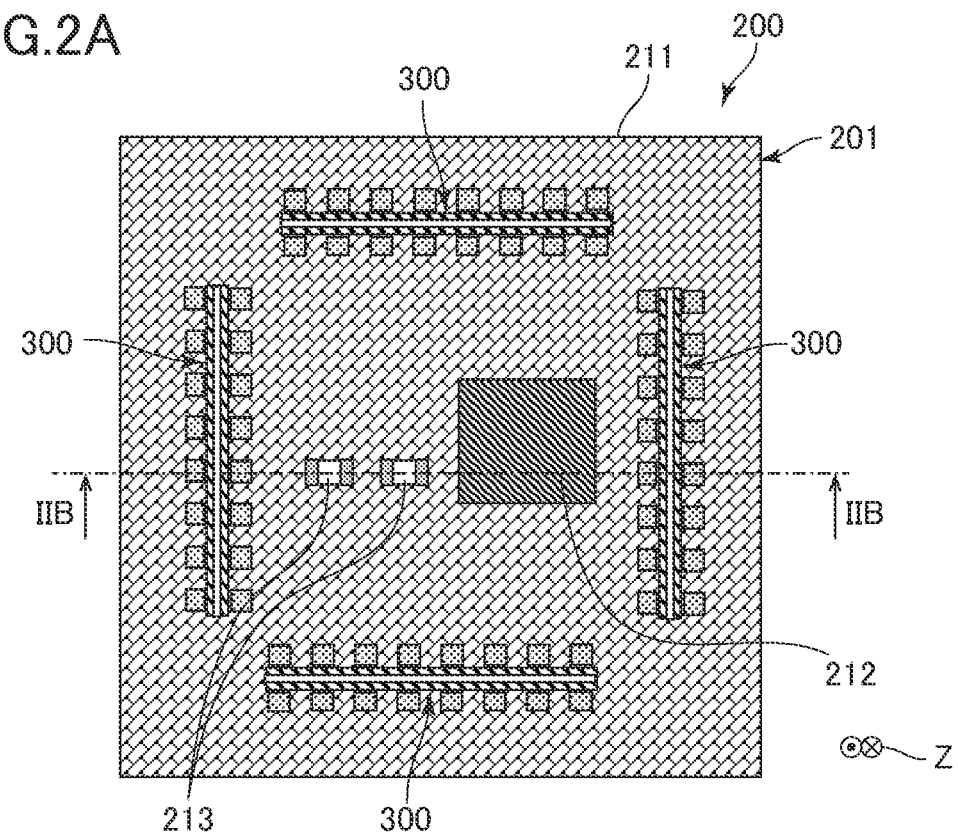
FIG. 2A is a plan view of an image pickup module serving as an example of an electronic module according to the first embodiment.
Figure 2B:
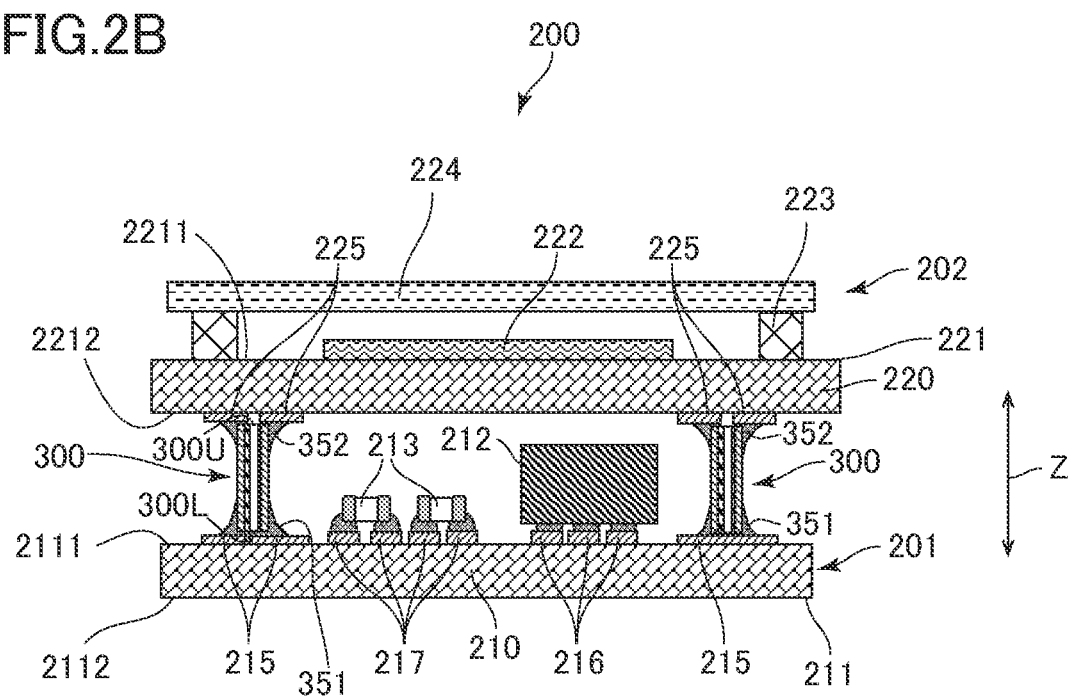
FIG. 2B is a section view of the image pickup module according to the first embodiment.

FIG. 2A is a plan view of the image pickup module 200, and FIG. 2B is a section view of the image pickup module 200. In FIG. 2A, illustration of the circuit unit 202 is omitted for the sake of convenience of description. FIG. 2B is a section view of the image pickup module 200 taken along a line BB-BB illustrated in FIG. 2A.

The circuit unit 201 is a printed wiring board, a printed circuit board, or a semiconductor package, and is, for example, a printed circuit board in the first embodiment. The circuit unit 202 is a printed wiring board, a printed circuit board, or a semiconductor package, and is, for example, a semiconductor package in the first embodiment.

The circuit unit 201 and the circuit unit 202 are arranged at an interval so as to oppose each other in a Z direction serving as a lamination direction. The plurality of intermediate connection members 300 are disposed between the circuit unit 201 and the circuit unit 202 as an example of at least one intermediate connection member.

The intermediate connection members 300 are each disposed between the circuit unit 201 and the circuit unit 202, and used for electrically and mechanically interconnecting the circuit unit 201 and the circuit unit 202.

The circuit unit 202 includes a wiring board 221 having two main surfaces 2211 and 2212, and an image sensor 222 disposed on the main surface 2211 of the wiring board 221. The main surface 2212 is a main surface opposing the wiring board 211. The main surface 2211 is a main surface on the back side of the main surface 2212. The wiring board 221 is an example of a second wiring board, and is a package board. In addition, the wiring board 221 is a rigid printed wiring board. The image sensor 222 is an example of a second semiconductor element, and is, for example, a semiconductor chip. In addition, the circuit unit 202 includes a frame 223 disposed on the main surface 2211 of the wiring board 221 to surround the image sensor 222, and a lid 224 disposed on the frame 223 so as to oppose the image sensor 222 with an interval therebetween. For the lid 224, for example, a glass substrate is used.

The wiring board 221 includes an insulating substrate 220 having a flat plate shape. The material of the insulating substrate 220 is preferably resin having a small thermal expansion coefficient. The main surfaces 2211 and 2212 of the wiring board 221 are also main surfaces of the insulating substrate 220.

The image sensor 222 is, for example, a complementary metal oxide semiconductor: CMOS image sensor, or a charge coupled device: CCD image sensor. The image sensor 222 has a function of converting light incident through the lens unit 602 into an electric signal, and generating image data on the basis of the electric signal. Due to the increase in the resolution of images, the size of the image sensor 222 is preferably a large size such as an advanced photo system type C: APSC size or a full size.

The circuit unit 201 includes a wiring board 211 having two main surfaces 2111 and 2112, a memory 212 disposed on the main surface 2111 of the wiring board 211, and electronic parts 213 disposed on the main surface 2111 of the wiring board 211. The memory 212 is an example of a first semiconductor element. The main surface 2111 is a main surface opposing the wiring board 221. The main surface 2112 is a main surface on the back side of the main surface 2111. The wiring board 211 is an example of a first wiring board, and is a rigid printed wiring board. The memory 212 is, for example, a semiconductor chip, and is capable of storing image data in the first embodiment. The electronic parts 213 are each a chip part that is smaller than the memory 212, and are each, for example, a passive element such as a resistor, a condenser, an inductor, or the like, or an active element such as a semiconductor part. As described above, the electronic parts 213 and the memory 212 that is relatively large are mounted on the main surface 2111 of the wiring board 211 as at least one mounted part.

The wiring board 211 includes an insulating substrate 210 having a flat plate shape. The material of the insulating substrate 210 is preferably resin such as epoxy resin containing glass fiber. The main surfaces 2111 and 2112 of the wiring board 211 are also main surfaces of the insulating substrate 210.

In the first embodiment, the main surface 2111 of the wiring board 211 is disposed to oppose the main surface 2212 of the wiring board 221 in the Z direction. Therefore, the memory 212 and the electronic parts 213 are interposed between the wiring board 211 and the wiring board 221 in the Z direction. The plurality of intermediate connection members 300 are interposed between the wiring board 211 and the wiring board 221 so as to maintain the interval between the wiring board 211 and the wiring board 221 such that the memory 212 and the electronic parts 213 do not interfere with the wiring board 221. That is, the plurality of intermediate connection members 300 also function as a spacer.

The plurality of intermediate connection members 300 are disposed to surround the memory 212 and the electronic parts 213. In the first embodiment, four intermediate connection members 300 are provided. The intermediate connection members 300 are each configured to electrically interconnect a signal wiring, a power supply wiring, and a ground wiring of the wiring board 211 and a signal wiring, a power supply wiring, and a ground wiring of the wiring board 221.

The wiring board 221 includes a plurality of pads 225 disposed at positions corresponding to the intermediate connection members 300. The plurality of pads 225 are provided on the main surface 2212. The pads 225 are each a conductive member, and is formed from, for example, metal such as copper. For example, the pads 225 are each a signal pad, a power supply pad, a ground pad, or a dummy pad. The intermediate connection members 300 are each bonded to a corresponding one of the plurality of pads 225 via a conductive bonding member 352 such as solder. In the case where the bonding members 352 bonding the intermediate connection members 300 to the wiring board 221 are solder, it can be said that the intermediate connection members 300 are soldered to the wiring board 221.

To be noted, an unillustrated solder resist film may be provided on the main surface 2212. In this case, it is preferable that an opening is provided at a position corresponding to each of the pads 225 in the solder resist film. The shape of each of the pads 225 is not particularly limited, and may be, for example, a circular shape or a polygonal shape in plan view. In addition, the relationship between the solder resist film and the pads may be either of solder mask defined: SMD and non solder mask defined: NSMD.

The wiring board 211 includes a plurality of pads 215 disposed at positions corresponding to the intermediate connection members 300, a plurality of pads 216 disposed at positions corresponding to the memory 212, and a plurality of pads 217 disposed at positions corresponding to the electronic parts 213. The pads 215, 216, and 217 are provided on the main surface 2111. The pads 215, 216, and 217 are each a conductive member formed from, for example, metal such as copper. For example, the pads 215, 216, and 217 are each a signal pad, a power supply pad, a ground pad, or a dummy pad. The intermediate connection members 300 are each bonded to a corresponding one of the plurality of pads 215 via a conductive bonding member 351 such as solder. In the case where the bonding members 351 bonding the intermediate connection members 300 to the wiring board 211 are solder, it can be said that the intermediate connection members 300 are soldered to the wiring board 211. The memory 212 is bonded to the plurality of pads 216 via conductive bonding members such as solder. The electronic parts 213 are each bonded to corresponding ones of the plurality of pads 217 via conductive bonding members such as solder.

To be noted, an unillustrated solder resist film may be provided on the main surface 2111. In this case, it is preferable that an opening is provided at a position corresponding to each of the pads 215, 216, and 217 in the solder resist film. The shape of each of the pads 215, 216, and 217 is not particularly limited, and may be, for example, a circular shape or a polygonal shape in plan view. In addition, the relationship between the solder resist film and the pads may be either of SMD and NSMD.

Figure 3A:
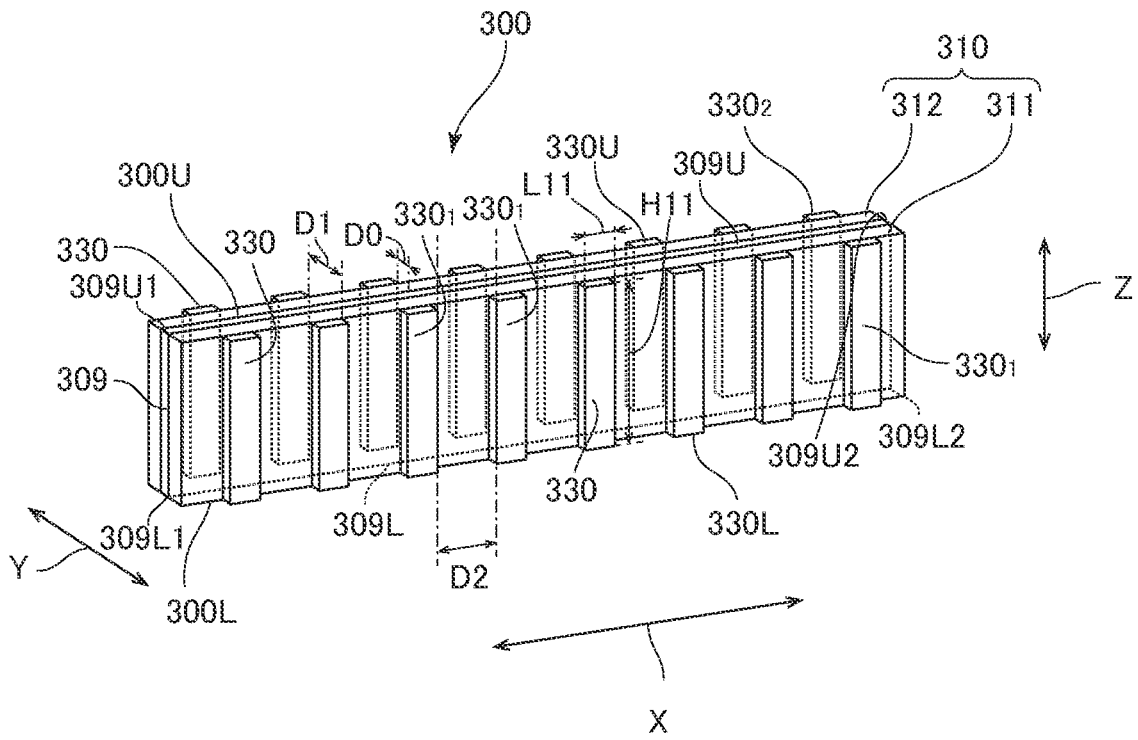
FIG. 3A is a perspective view of an intermediate connection member according to the first embodiment.
Figure 3B:
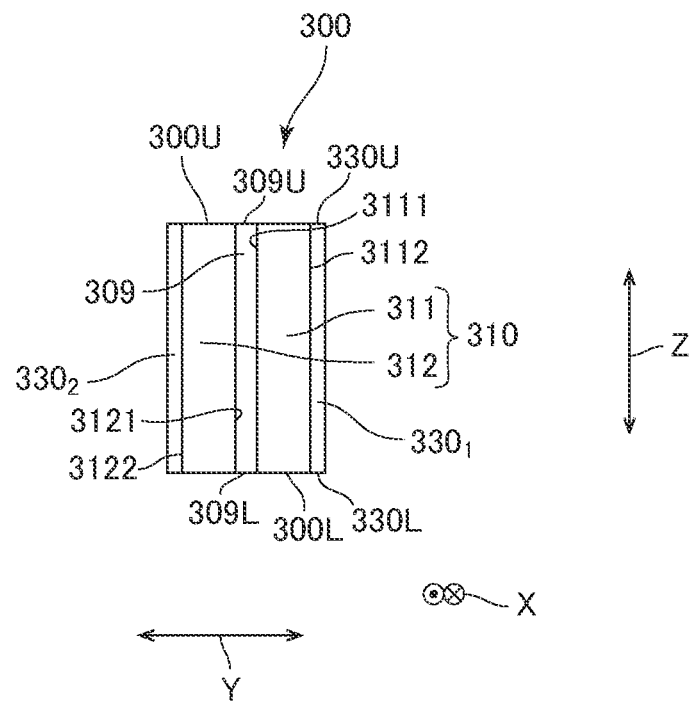
FIG. 3B is a section view of the intermediate connection member according to the first embodiment.

The plurality of intermediate connection members 300 each have substantially the same configuration. Description will be given below focusing on one of the intermediate connection members 300. FIG. 3A is a perspective view of the intermediate connection member 300 according to the first embodiment. FIG. 3B is a section view of the intermediate connection member 300.

The intermediate connection member 300 is, for example, a rigid wiring board having a rectangular parallelepiped shape. Here, the longitudinal direction of the intermediate connection member 300 will be referred to as an X direction, and the width direction, that is, the thickness direction of the intermediate connection member 300 will be referred to as a Y direction. The height direction of the intermediate connection member 300, that is, the short side direction of the intermediate connection member 300 is a Z direction. The Z direction is an example of a first direction, the X direction is an example of a second direction, and the Y direction is an example of a third direction. The X direction, the Y direction, and the Z direction intersect each other. In the present embodiment, the X direction, the Y direction, and the Z direction are orthogonal to each other. The intermediate connection member 300 preferably has a rectangular parallelepiped shape longer in the X direction so as to electrically and mechanically interconnect the two circuit units 201 and 202, that is, the two wiring boards 211 and 221 while maintaining the interval between the two main surfaces 2111 and 2212 opposing each other in the Z direction.

The intermediate connection member 300 has an end surface 300L and an end surface 300U provided at an interval in the Z direction. The end surface 300L opposes the mains surface 2111 of the wiring board 211 in the Z direction. The end surface 300U opposes the main surface 2212 of the wiring board 221 in the Z direction.

The intermediate connection member 300 includes an insulating board 310 that is an example of insulator and that has a flat plate shape, a metal layer 309 disposed inside the insulating board 310, and a plurality of, for example, 16 wirings 330 disposed on the insulating board 310 and each extending in the Z direction. The wirings 330 are each supported by the insulating board 310. As described above, a large number of wirings 330 are highly densely arranged on the insulating board 310.

The material of the insulating board 310 is preferably resin such as epoxy resin containing glass fiber. In consideration of high-density integration and securing the mounting area of mounted parts in the image pickup module 200, the thickness of the intermediate connection member 300 in the Y direction is preferably 5 mm or less, and therefore the thickness of the insulating board 310 in the Y direction is preferably 2 mm or less. The thickness of the metal layer 309 in the Y direction is preferably 0.5 mm or less in consideration of the thickness of the intermediate connection member 300 in the Y direction, the thickness of the insulating board 310 in the Y direction, the thickness of the wirings 330 in the Y direction, and the pitch of the wirings 330 in the X direction.

The wirings 330 are each electrically connected to a signal wiring, a power supply wiring, a ground wiring, or a dummy wiring of each of the wiring boards 211 and 221. The wirings 330 each extend from one end to the other end of the insulating board 310 in the Z direction. A dimension H11 of each of the wirings 330 in the Z direction is larger than a dimension L11 of each of the wirings 330 in the X direction. Among two end surfaces 330L and 330U of each of the wirings 330 in the Z direction, the end surface 330L is included in the end surface 300L of the intermediate connection member 300. The end surface 330L is bonded to corresponding one of the plurality of pads 215 in FIG. 2B via the bonding member 351. Among the two end surfaces 330L and 330U of each of the wirings 330 in the Z direction, the end surface 330U is included in the end surface 300U of the intermediate connection member 300. The end surface 330U is bonded to corresponding one of the plurality of pads 225 in FIG. 2B via the bonding member 352. As described above, the pads 215 of the wiring board 211 and the wirings 330 of the intermediate connection member 300 are electrically and mechanically interconnected by the bonding members 351, and the pads 225 of the wiring board 221 and the wirings 330 of the intermediate connection member 300 are electrically and mechanically interconnected by the bonding member 352.

The bonding members 351 and 352 are each a conductive member including, for example, solder. The material of the bonding members 352 is the same as the material of the bonding members 351. The solder included in the bonding members 351 and 352 is preferably Sn—Ag—Cu, Sn—Bi, or the like. To be noted, although the bonding members 351 and 352 preferably include solder, the configuration is not limited to this, and for example, an inorganic material such as copper, silver, or aluminum may be included, or an organic material such as conductive rubber may be included. In addition, for example, the bonding members 351 and 352 may be each a cured product of an organic conductive adhesive.

The insulating board 310 includes two insulating substrates 311 and 312. The insulating substrate 311 is an example of a first insulating substrate, and the insulating substrate 312 is an example of a second insulating substrate. The insulating substrates 311 and 312 are each an insulating member having a flat plate shape. The insulating substrate 312 is disposed with a distance from the insulating substrate 311 in the Y direction. Among the 16 wirings 330, a plurality of, 8 wirings $330_1$ in the present embodiment are disposed on the insulating substrate 311 of the insulating board 310. Among the plurality of wirings 330, the plurality of wirings other than the wirings $330_1$, 8 other wirings $330_2$ in the present embodiment are disposed on the insulating substrate 312 of the insulating board 310. The wirings $330_1$ are each an example of a first wiring. The wirings $330_2$ are each an example of a second wiring. The plurality of wirings $330_1$ are arranged at intervals in the X direction. The plurality of wirings $330_2$ are arranged at intervals in the X direction.

The wirings 330 and the metal layer 309 are each a conductive member including, for example, an inorganic material such as copper, silver, or aluminum, or an organic material such as conductive rubber. The wirings 330 may be each formed by crimping metal foil, or applying a conductive paste by a dispenser or the like and then firing the conductive paste.

The plurality of wirings $330_1$ are disposed on one of two outer side surfaces of the insulating board 310 arranged at an interval in the Y direction, and the plurality of wirings $330_2$ are disposed on the other of the two outer side surfaces. That is, the insulating substrate 311 of the insulating board 310 is interposed between the plurality of wirings $330_1$ and the metal layer 309, and the insulating substrate 312 of the insulating board 310 is interposed between the plurality of wirings $330_2$ and the metal layer 309.

The insulating substrate 311 of the insulating board 310 includes a surface 3111 opposing the insulating substrate 312, and a surface 3112 on the back side of the surface 3111. The insulating substrate 312 of the insulating board 310 includes a surface 3121 opposing the insulating substrate 311, and a surface 3122 on the back side of the surface 3121. The surface 3111 and the surface 3121 oppose each other. The surfaces 3112 and 3122 also serve as outer side surfaces of the insulating board 310. That is, the plurality of wirings $330_1$ are disposed on the surface 3112, and the plurality of wirings $330_2$ are disposed on the surface 3122. The metal layer 309 is interposed between the surfaces 3111 and 3121.

As described above, the metal layer 309 is interposed between the plurality of wirings $330_1$ and the plurality of wirings $330_2$ and between the insulating substrate 311 and the insulating substrate 312. As a result of this, the metal layer 309 opposes the plurality of wirings $330_1$ and the plurality of wirings $330_2$ in the Y direction.

The metal layer 309 extends from one end to the other end of the insulating substrates 311 and 312 in the Z direction. Two side surfaces 309L and 309U of the metal layer 309 in the Z direction are exposed to the outside. The end surface 309L is included in the end surface 300L of the intermediate connection member 300. The end surface 309U is included in the end surface 300U of the intermediate connection member 300. That is, the end surface 309L of the metal layer 309 is not covered by the insulating board 310 and is thus exposed from the insulating board 310, in a region from a first end 309L1 to a second end 309L2 in the X direction of the end surface 300L of the intermediate connection member 300. In addition, the end surface 309U of the metal layer 309 is not covered by the insulating board 310 and is thus exposed from the insulating board 310, in a region from a first end 309U1 to a second end 309U2 in the X direction of the end surface 300U of the intermediate connection member 300.

Figure 4A:
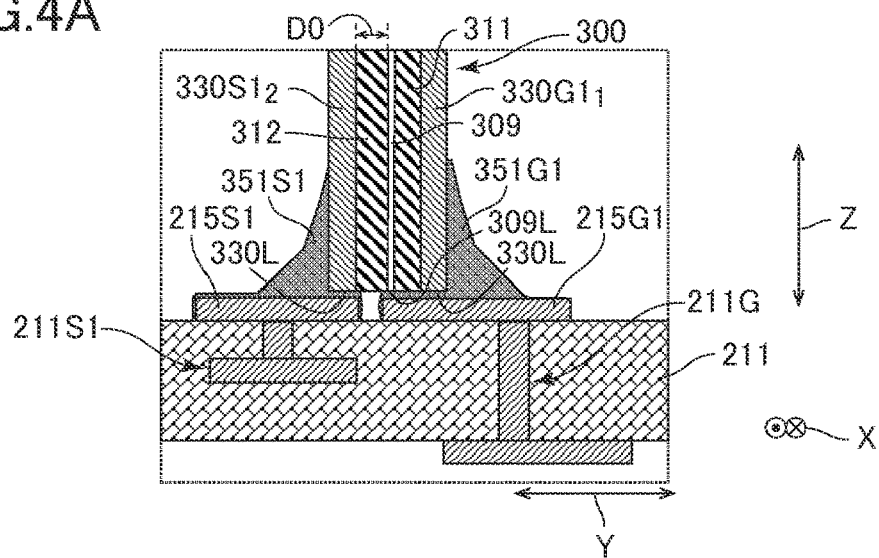
FIG. 4A is an enlarged section view of a connection structure between a wiring board and the intermediate connection member according to the first embodiment.
Figure 4B:
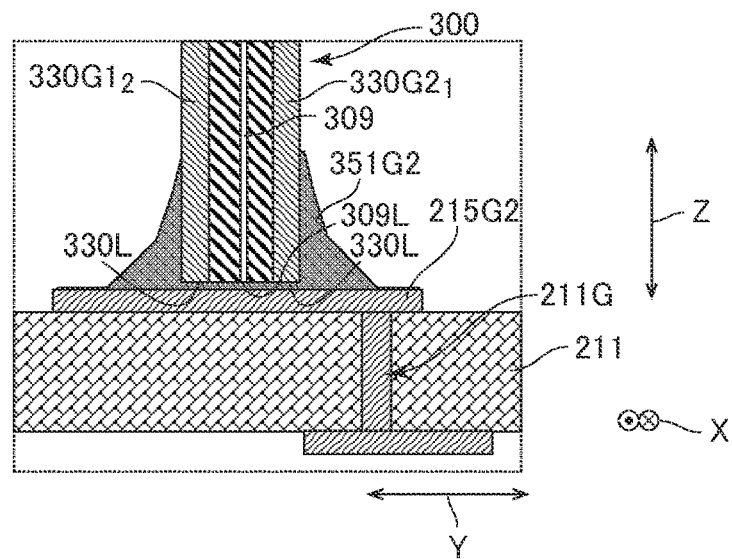
FIG. 4B is an enlarged section view of the connection structure between the wiring board and the intermediate connection member according to the first embodiment.
Figure 4C:
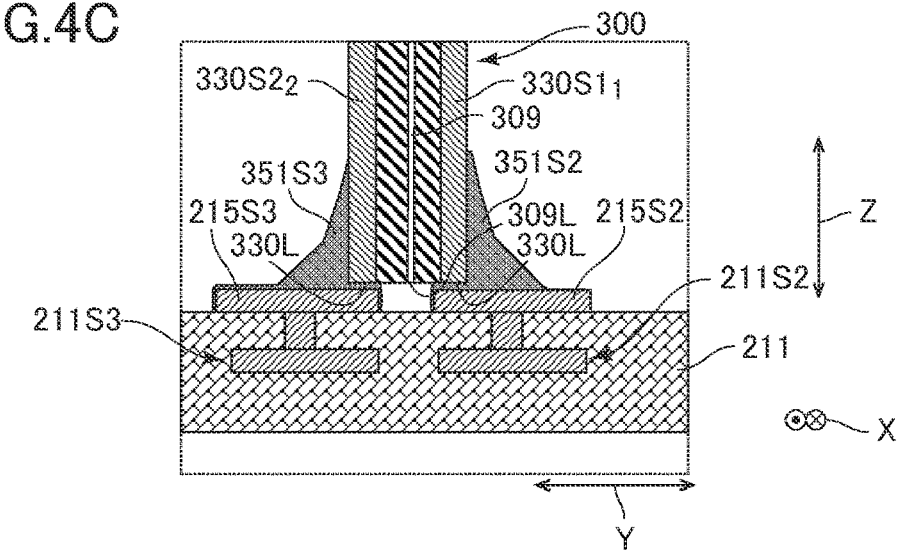
FIG. 4C is an enlarged section view of the connection structure between the wiring board and the intermediate connection member according to the first embodiment.
Figure 5A:
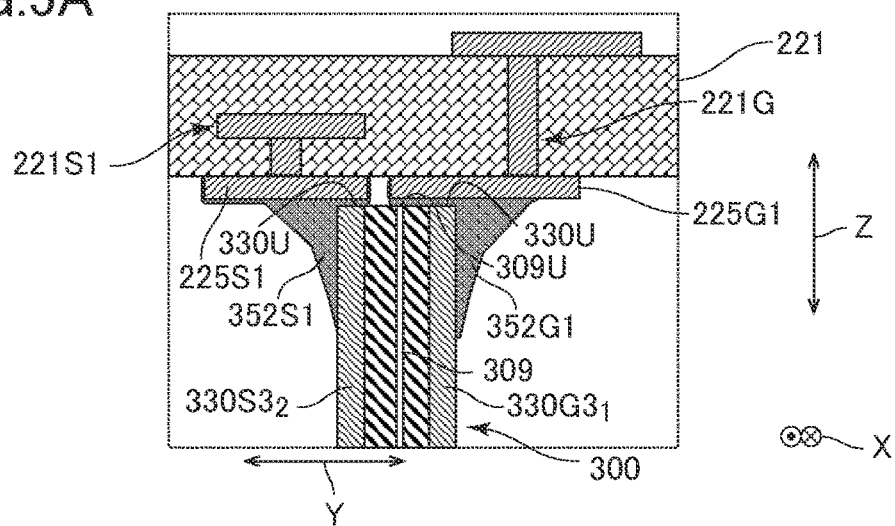
FIG. 5A is an enlarged section view of a connection structure between a wiring board and the intermediate connection member according to the first embodiment.
Figure 5B:
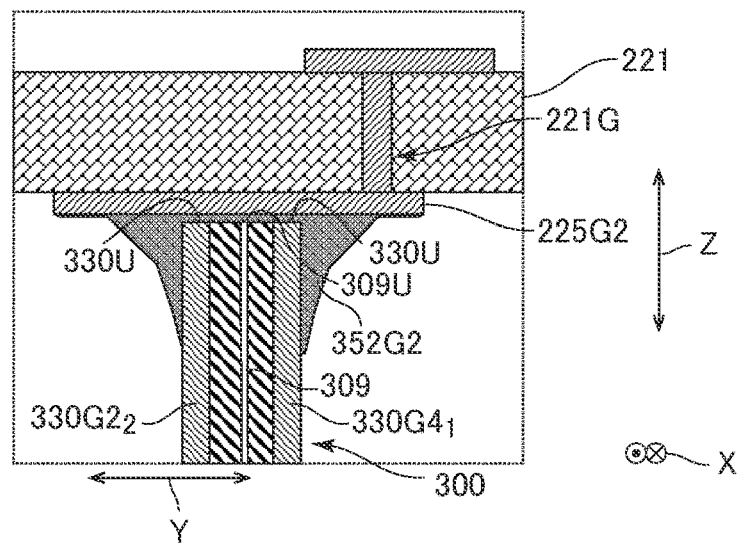
FIG. 5B is an enlarged section view of the connection structure between the wiring board and the intermediate connection member according to the first embodiment.
Figure 5C:
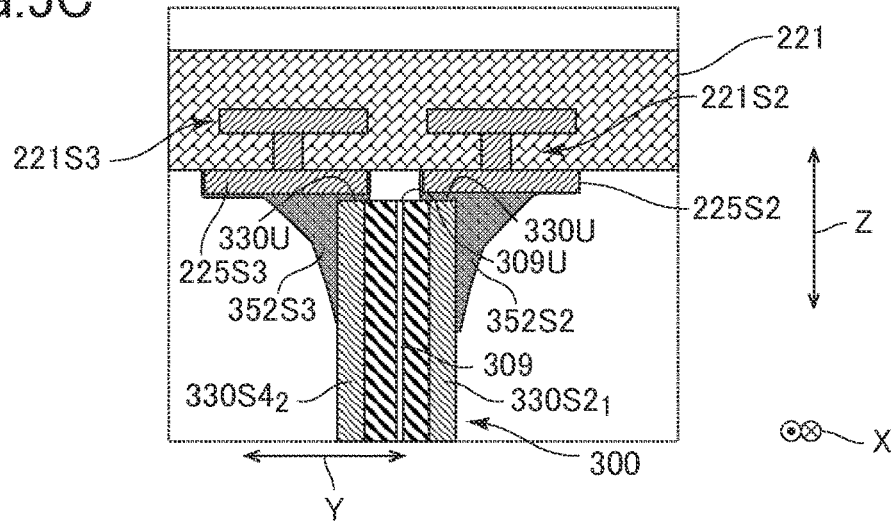
FIG. 5C is an enlarged section view of the connection structure between the wiring board and the intermediate connection member according to the first embodiment.

FIGS. 4A to 4C are enlarged section views of a connection structure between the wiring board 211 and the intermediate connection member 300 according to the first embodiment. FIGS. 5A to 5C are enlarged section views of a connection structure between the wiring board 221 and the intermediate connection member 300 according to the first embodiment. FIGS. 4A to 5C illustrate cross-sections of the connection structure at different positions in the X direction.

The wiring board 211 includes a ground wiring 211G, a plurality of signal wirings 211S1, 211S2, and 211S3, and an unillustrated power supply wiring. The ground wiring 211G is an example of a first ground. The signal wirings 211S1, 211S2, and 211S3 are each used for transmission of a digital signal. The ground wiring 211G includes a plurality of ground pads 215G1 and 215G2. The ground pads 215G1 and 215G2 are each an example of a first ground pad. The signal wiring 211S1 includes a signal pad 215S1. The signal wiring 211S2 includes a signal pad 215S2. The signal wiring 211S3 includes a signal pad 215S3.

The wiring board 221 includes a ground wiring 221G, a plurality of signal wirings 221S1, 221S2, and 221S3, and an unillustrated power supply wiring. The ground wiring 221G is an example of a second ground. The signal wirings 221S1, 221S2, and 221S3 are each used for transmission of a digital signal. The ground wiring 221G includes a plurality of ground pads 225G1 and 225G2. The ground pads 225G1 and 225G2 are each an example of a second ground pad. The signal wiring 221S1 includes a signal pad 225S1. The signal wiring 221S2 includes a signal pad 225S2. The signal wiring 221S3 includes a signal pad 225S3.

The plurality of wirings 330, that is, the plurality of wirings $330_1$ and the plurality of wirings $330_2$ include at least one signal wiring, at least one ground wiring, and at least one power supply wiring. In the example of FIGS. 4A to 5C, the plurality of wirings $330_1$ include a plurality of ground wirings $330G1_1$, $330G2_1$, $330G3_1$, and $330G4_1$, and a plurality of signal wirings $330S1_1$ and $330S2_1$. In addition, the plurality of wirings $330_2$ include a plurality of ground wirings $330G1_2$ and $330G2_2$, and a plurality of signal wirings $330S1_2$, $330S2_2$, $330S3_2$, and $330S4_2$. The signal wirings $330S1_1$, $330S2_1$, $330S1_2$, $330S2_2$, $330S3_2$, and $330S4_2$ are each used for transmission of a digital signal. The ground wirings $330G1_1$ and $330G2_1$ are each an example of a first ground wiring. The ground wiring $330G1_2$ is an example of a second ground wiring. The ground wirings $330G3_1$ and $330G4_1$ are each an example of a third ground wiring. The ground wiring $330G2_2$ is an example of a fourth ground wiring.

An interference noise of mutual interference or the like, a radiated noise, or a conducted noise is generated in a signal transmitted through each of the signal wirings $330S1_1$ to $330S4_2$. The metal layer 309 is wider in the X direction than each of the signal wirings $330S1_1$ to $330S4_2$. According to the first embodiment, the metal layer 309 disposed in the vicinity of each of the signal wirings $330S1_1$ to $330S4_2$ reduces these noises, and thus the quality of the transmitted signal is improved.

Specifically, since the metal layer 309 is disposed between the signal wiring $330S1_1$ and the signal wiring $330S2_2$, the interference noise between the signal wiring $330S1_1$ and the signal wiring $330S2_2$ can be reduced. Similarly, since the metal layer 309 is disposed between the signal wiring $330S2_1$ and the signal wiring $330S4_2$, the interference noise between the signal wiring $330S2_1$ and the signal wiring $330S4_2$ can be reduced. In addition, for each of the signal wirings $330S1_1$ to $330S4_2$, an interference noise with another signal wiring or a power supply wiring that is adjacent to the signal wiring in the X direction can be also reduced. In addition, since the metal layer 309 is disposed in the vicinity of each of the signal wirings $330S1_1$ to $330S4_2$, the radiated noise and the conducted noise in each of the signal wirings $330S1_1$ to $330S4_2$ can be reduced.

In the case where the bonding members 351 and 352 include solder, the metal layer 309 is preferably soldered to at least one of the wiring board 211 or the wiring board 221, and in the first embodiment, the metal layer 309 is soldered to both of the wiring boards 211 and 221. In the first embodiment, the metal layer 309 is bonded to the ground pads 215G1 and 215G2 respectively via bonding members 351G1 and 351G2 respectively corresponding thereto to be electrically connected to the ground wiring 211G. In the first embodiment, since the end surface 309L of the metal layer 309 is exposed to the outside of the insulating board 310, the end surface 309L is bonded to the ground pads 215G1 and 215G2 respectively via the bonding members 351G1 and 351G2. That is, part of the metal layer 309 sandwiched in the insulating board 310 is bonded to the ground pads 215G1 and 215G2 respectively via the bonding members 351G1 and 351G2. As a result of this, the metal layer 309 and the ground wiring 211G are at the same potential. The ground pads 215G1 and 215G2 oppose the end surface 309L of the metal layer 309 in the Z direction.

The ground wiring $330G1_1$ is electrically connected to the metal layer 309 and the ground wiring 211G by being bonded to the ground pad 215G1 via the bonding member 351G1, and is thus at the same potential as the metal layer 309 and the ground wiring 211G. The ground pad 215G1 opposes the end surface 330L of the ground wiring $330G1_1$ in the Z direction.

In the first embodiment, the ground pad 215G1 opposes the end surface 309L of the metal layer 309 and the end surface 330L of the ground wiring $330G1_1$ in the Z direction.

The ground wiring $330G2_1$ is electrically connected to the metal layer 309 and the ground wiring 211G by being bonded to the ground pad 215G2 via the bonding member 351G2, and is thus at the same potential as the metal layer 309 and the ground wiring 211G. The ground pad 215G2 opposes the end surface 330L of the ground wiring $330G2_1$ in the Z direction.

The ground wiring $330G1_2$ is electrically connected to the metal layer 309, the ground wiring 211G, and the ground wiring $330G2_1$ by being bonded to the ground pad 215G2 via the bonding member 351G2. Therefore, the ground wiring $330G1_2$ is at the same potential as the metal layer 309, the ground wiring 211G, and the ground wiring $330G2_1$. The ground pad 215G2 opposes the end surface 330L of the ground wiring $330G1_2$ in the Z direction.

In the first embodiment, the ground pad 215G2 has a larger area than the ground pad 215G1 as viewed in the Z direction. Further, the ground pad 215G2 opposes the end surface 309L of the metal layer 309, the end surface 330L of the ground wiring $330G2_1$, and the end surface 330L of the ground wiring $330G1_2$ in the Z direction.

The signal wiring $330S1_2$ is electrically connected to the signal wiring 211S1 by being bonded to the signal pad 215S1 via the bonding member 351S1. As viewed in the Y direction, the bonding member 351S1 overlaps the metal layer 309. In addition, the signal wiring $330S1_1$ is electrically connected to the signal wiring 211S2 by being bonded to the signal pad 215S2 via the bonding member 351S2. As viewed in the Y direction, the bonding member 351S2 overlaps the metal layer 309. In addition, the signal wiring $330S2_2$ is electrically connected to the signal wiring 211S3 by being bonded to the signal pad 215S3 via the bonding member 351S3. As viewed in the Y direction, the bonding member 351S3 overlaps the metal layer 309.

In the first embodiment, the metal layer 309 is bonded to the ground pads 225G1 and 225G2 respectively via the bonding members 352G1 and 352G2 so as to be electrically connected to the ground wiring 221G. In the first embodiment, since the end surface 309U of the metal layer 309 is exposed to the outside of the insulating board 310, the end surface 309U is bonded to the ground pads 225G1 and 225G2 respectively via the bonding members 352G1 and 352G2. That is, part of the metal layer 309 sandwiched in the insulating board 310 is bonded to the ground pads 225G1 and 225G2 respectively via the bonding members 352G1 and 352G2. As a result of this, the metal layer 309 and the ground wiring 221G are at the same potential. The ground pads 225G1 and 225G2 oppose the end surface 309U of the metal layer 309 in the Z direction.

The ground wiring $330G3_1$ is electrically connected to the metal layer 309 and the ground wiring 221G by being bonded to the ground pad 225G1 via the bonding member 352G1, and is thus at the same potential as the metal layer 309 and the ground wiring 221G. The ground pad 225G1 opposes the end surface 330U of the ground wiring $330G3_1$ in the Z direction.

In the first embodiment, the ground pad 225G1 opposes the end surface 309U of the metal layer 309 and the end surface 330U of the ground wiring $330G3_1$ in the Z direction.

The ground wiring $330G4_1$ is electrically connected to the metal layer 309 and the ground wiring 221G by being bonded to the ground pad 225G2 via the bonding member 352G2, and is thus at the same potential as the metal layer 309 and the ground wiring 221G. The ground pad 225G2 opposes the end surface 330U of the ground wiring $330G4_1$ in the Z direction.

The ground wiring $330G2_2$ is electrically connected to the metal layer 309, the ground wiring 221G, and the ground wiring $330G4_1$ by being bonded to the ground pad 225G2 via the bonding member 352G2. Therefore, the ground wiring $330G2_2$ is at the same potential as the metal layer 309, the ground wiring 221G, and the ground wiring $330G4_1$. The ground pad 225G2 opposes the end surface 330U of the ground wiring $330G2_2$ in the Z direction.

In the first embodiment, the ground pad 225G2 has a larger area than the ground pad 225G1 as viewed in the Z direction. Further, the ground pad 225G2 opposes the end surface 309U of the metal layer 309, the end surface 330U of the ground wiring $330G4_1$, and the end surface 330U of the ground wiring $330G2_2$ in the Z direction.

The signal wiring $330S3_2$ is electrically connected to the signal wiring 221S1 by being bonded to the signal pad 225S1 via the bonding member 352S1. As viewed in the Y direction, the bonding member 352S1 overlaps the metal layer 309. In addition, the signal wiring $330S2_1$ is electrically connected to the signal wiring 221S2 by being bonded to the signal pad 225S2 via the bonding member 352S2. As viewed in the Y direction, the bonding member 352S2 overlaps the metal layer 309. In addition, the signal wiring $330S4_2$ is electrically connected to the signal wiring 221S3 by being bonded to the signal pad 225S3 via the bonding member 352S3. As viewed in the Y direction, the bonding member 352S3 overlaps the metal layer 309.

As described above, since the metal layer 309 is at the ground potential, the noise on the signal transmitted through each signal wiring can be effectively reduced.

To be noted, the ground wiring $330G1_1$ illustrated in FIG. 4A may be bonded to an unillustrated ground pad of the ground wiring 221G of the wiring board 221 via a bonding member together with the metal layer 309 as in FIG. 5A. In addition, the signal wiring $330S1_2$ illustrated in FIG. 4A may be bonded to an unillustrated signal pad of an unillustrated signal wiring of the wiring board 221 via a bonding member as in FIG. 5A.

In addition, the ground wirings $330G2_1$ and $330G1_2$ illustrated in FIG. 4B may be bonded to unillustrated ground pads of the ground wiring 221G of the wiring board 221 via bonding members together with the metal layer 309 as in FIG. 5B.

In addition, the signal wiring $330S1_1$ illustrated in FIG. 4C may be bonded to an unillustrated signal pad of an unillustrated signal wiring of the wiring board 221 via a bonding member as in FIG. 5C. In addition, the signal wiring $330S2_2$ illustrated in FIG. 4C may be bonded to an unillustrated signal pad of an unillustrated signal wiring of the wiring board 221 via a bonding member as in FIG. 5C.

In addition, the ground wiring $330G3_1$ illustrated in FIG. 5A may be bonded to an unillustrated ground pad of the ground wiring 211G of the wiring board 211 via a bonding member together with the metal layer 309 as in FIG. 4A. In addition, the signal wiring $330S3_2$ illustrated in FIG. 5A may be bonded to an unillustrated signal pad of an unillustrated signal wiring of the wiring board 211 via a bonding member as in FIG. 4A.

In addition, the ground wirings $330G4_1$ and $330G2_2$ illustrated in FIG. 5B may be bonded to unillustrated ground pads of the ground wiring 211G of the wiring board 211 via bonding members together with the metal layer 309 as in FIG. 4B.

In addition, the signal wiring $330S2_1$ illustrated in FIG. 5C may be bonded to an unillustrated signal pad of an unillustrated signal wiring of the wiring board 211 via a bonding member as in FIG. 4C. In addition, the signal wiring $330S4_2$ illustrated in FIG. 5C may be bonded to an unillustrated signal pad of an unillustrated signal wiring of the wiring board 211 via a bonding member as in FIG. 4C.

In addition, in FIGS. 4A to 5C, a power supply wiring may be provided instead of the signal wiring $330S1_1$, $330S2_1$, $330S1_2$, $330S2_2$, $330S3_2$, or $330S4_2$, and a corresponding pad may be a power supply pad. In addition, one of these wirings may be bonded to a dummy pad.

A larger current flows in the ground wirings $330G1_1$, $330G2_1$, $330G3_1$, $330G4_1$, $330G1_2$, and $330G2_2$ included in the intermediate connection member 300 than in the signal wirings. Therefore, the ground wirings $330G1_1$ to $330G2_2$ are each required to have a lower resistance. Therefore, the ground wirings $330G1_1$ to $330G2_2$ may be each constituted by a conductive material having a lower resistance or a wire having a large diameter.

The width in the X direction and the thickness in the Y direction of each of the wirings 330 may be determined in consideration of the use of the wiring and the use of the electronic part 320 to which the wiring 330 is connected, but is preferably 0.01 mm to 2 mm. In consideration of the high-density integration of the plurality of wirings 330, the width in the X direction and the thickness in the Y direction of each of the wirings 330 is preferably 0.5 mm or less. The width (thickness) in the Y direction of the metal layer 309 is preferably larger than a distance D2 in the X direction between two adjacent wirings $330_1$ among the plurality of wirings $330_1$.

The length in the X direction of the intermediate connection member 300 is preferably smaller than the length of each side of each of the wiring boards 211 and 221. The width in the Y direction of the intermediate connection member 300 is preferably as small as possible because this increases the mounting area where parts can be mounted on the wiring board 211. The height in the Z direction of the intermediate connection member 300 is preferably larger than the height of the tallest mounted part such as the memory 212. For example, in the case where a mounted part having a height of 1.6 mm is mounted on the wiring board 211, the height of the intermediate connection member 300 in the Z direction is preferably larger than 1.6 mm. The number and pitch of the wirings 330 of the intermediate connection member 300 depend on the number and pitch of the pads of the wiring boards 211 and 221. To be noted, the pitch of the plurality of wirings $330_1$ may be set to be equal to or different from the pitch of the plurality of wirings $330_2$.

A distance D0 in the Y direction between the metal layer 309 and one of the plurality of signal wirings $330S1_1$ to $330S4_2$, for example, the signal wiring $330S1_2$ is preferably equal to or smaller than a distance D1 between two closest wirings among the plurality of wirings $330_1$ and the plurality of wirings $330_2$. The two closest wirings among the plurality of wirings $330_1$ and the plurality of wirings $330_2$ are, in the first embodiment, one wiring $330_1$ and one wiring $330_2$ that are adjacent in the Y direction with the metal layer 309 therebetween. In addition, in the first embodiment, the distance D0 is preferably equal to or smaller than the distance D2 between two adjacent wirings $330_1$ in the X direction among the plurality of wirings $330_1$. As described above, as a result of the signal wirings $330S1_1$ to $330S4_2$ each being disposed near the metal layer 309, the noise on the signal can be more effectively reduced.

The metal layer 309 is preferably a metal member as a solid pattern, but the configuration is not limited to this. For example, the metal layer 309 may be a metal member having a mesh shape, or a metal member formed by connecting a plurality of metal plates arranged at intervals in the X direction via wires. The metal layer 309 is preferably a continuous metal member.

Next, a manufacturing method for the image pickup module 200 will be described. FIGS. 6A to 7C are each an explanatory diagram of a step in the manufacturing method of the image pickup module 200.

Figure 6A:
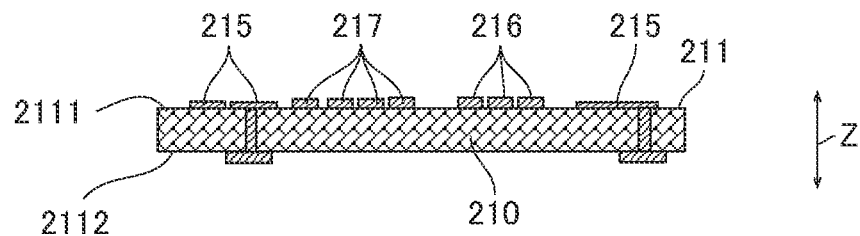
FIG. 6A is an explanatory diagram of a manufacturing method for the image pickup module according to the first embodiment.

In a step illustrated in FIG. 6A, the wiring board 211 is prepared. The wiring board 211 includes the plurality of pads 215, the plurality of pads 216, and the plurality of pads 217.

Figure 6B:
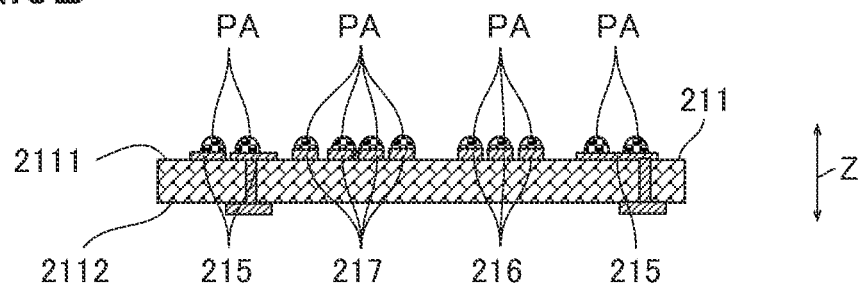
FIG. 6B is an explanatory diagram of the manufacturing method for the image pickup module according to the first embodiment.

Next, in a step illustrated in FIG. 6B, a conductive paste PA is disposed on each of the pads 215 to 217. The conductive paste PA is, for example, preferably a conductive adhesive such as a solder paste or a silver paste. In addition, the conductive paste PA may be a conductive adhesive having a sheet shape. The conductive paste PA is preferably a solder paste containing solder powder and flux. The conductive paste PA can be supplied by, for example, screen printing or using a dispenser. The conductive paste PA may be supplied to cover the entirety of the exposed portion of each of the pads 215 to 217, or may be supplied to cover part of the exposed portion of each of the pads 215 to 217 as in offset printing.

Figure 6C:
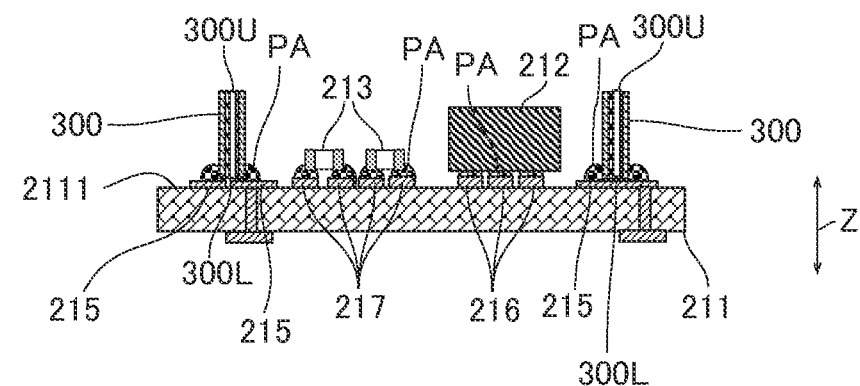
FIG. 6C is an explanatory diagram of the manufacturing method for the image pickup module according to the first embodiment.

In a step illustrated in FIG. 6C, the wiring board 211 is disposed at a predetermined position in an orientation in which each of the pads 215 to 217 on the wiring board 211 faces up in the vertical direction. Further, the memory 212, the electronic parts 213, and the intermediate connection members 300 are placed on the main surface 211I of the wiring board 211. That is, the memory 212 is placed on the pads 216 in contact with the conductive paste PA, and the electronic parts 213 are placed on the pads 217 in contact with the conductive paste PA. The intermediate connection members 300 are placed on the pads 215 by bringing each of the wirings 330 into contact with corresponding part of the conductive paste PA. The memory 212, the electronic parts 213, and the intermediate connection members 300 are placed on the wiring board 211 by using an unillustrated mounter.

Figure 6D:
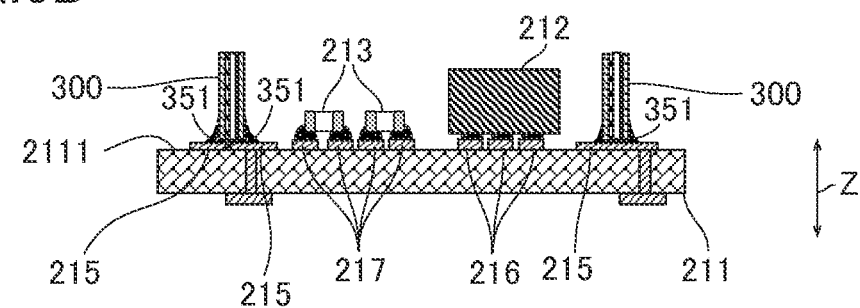
FIG. 6D is an explanatory diagram of the manufacturing method for the image pickup module according to the first embodiment.

Next, the conductive paste PA is heated to a temperature equal to or higher than a temperature at which the metal powder contained in the conductive paste PA, for example, solder powder melts. As a result of this, the solder powder melts, and the molten solder aggregates. Then, the molten solder solidifies through a step of cooling the molten solder. As a result of this, as illustrated in FIG. 6D, the memory 212, the electronic parts 213, and the intermediate connection members 300 are bonded to the wiring board 211. To be noted, the heating step of heating and melting the conductive paste PA and the cooling step of cooling and solidifying the molten metal illustrated in FIG. 6D can be preformed in, for example, a reflow furnace. The intermediate connection members 300 are bonded to corresponding pads 215 via corresponding bonding members 351.

Figure 7A:
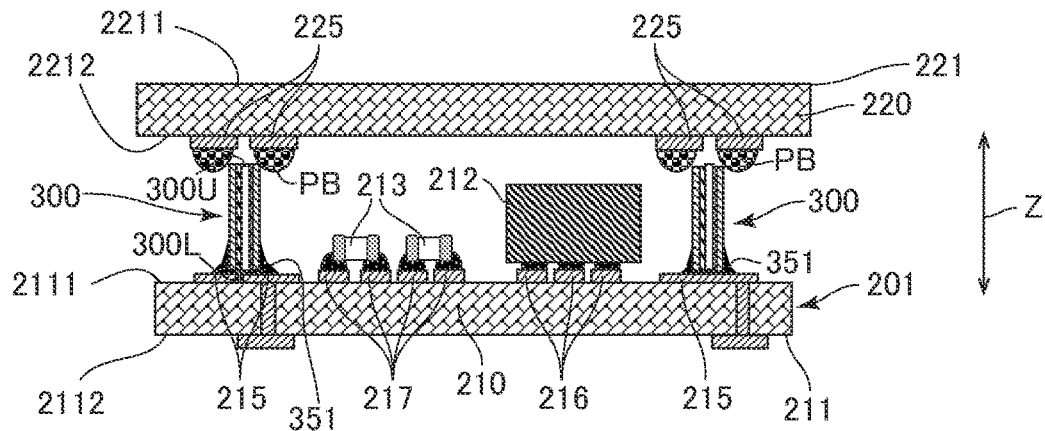
FIG. 7A is an explanatory diagram of the manufacturing method for the image pickup module according to the first embodiment.

Next, in a step illustrated in FIG. 7A, a conductive paste PB is disposed on each of the pads 225 of the wiring board 221. The conductive paste PB is, for example, preferably a conductive adhesive such as a solder paste or a silver paste. In addition, the conductive paste PB may be a conductive adhesive having a sheet shape. The conductive paste PB is preferably a solder paste containing solder powder and flux, and is preferably the same material as the conductive paste PA described above. The conductive paste PB can be supplied by, for example, screen printing or using a dispenser. The conductive paste PB may be supplied to cover the entirety of the exposed portion of each of the pads 225, or may be supplied to cover part of the exposed portion of each of the pads 225 as in offset printing.

Then, the wiring board 221 is placed on the end surface 300U of the intermediate connection members 300 in an orientation in which the pads 225 of the wiring board 221 face down in the vertical direction. That is, the conductive paste PB on each of the pads 225 is brought into contact with the end surface 330U of the corresponding wiring 330 illustrated in FIG. 3A. The circuit unit 202 is placed on the intermediate connection members 300 by an unillustrated mounter.

Figure 7B:
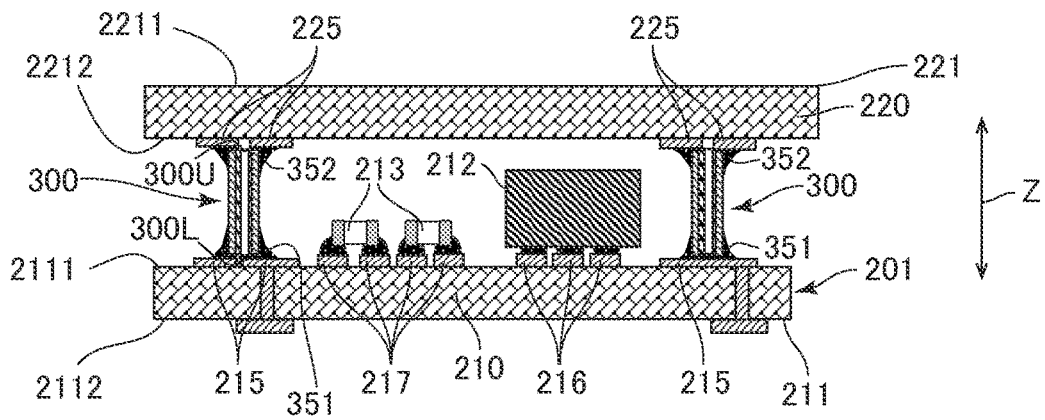
FIG. 7B is an explanatory diagram of the manufacturing method for the image pickup module according to the first embodiment.

Next, the conductive paste PB is heated to a temperature equal to or higher than a temperature at which the metal powder contained in the conductive paste PB, for example, solder powder melts. As a result of this, the solder powder melts, and the molten solder aggregates. Then, the molten solder solidifies through a step of cooling the molten solder. As a result of this, as illustrated in FIG. 7B, the intermediate connection members 300 and the wiring board 221 are bonded to each other via corresponding bonding members 352. To be noted, the heating step and the cooling step of the conductive paste PB can be preformed in, for example, a reflow furnace.

Figure 7C:
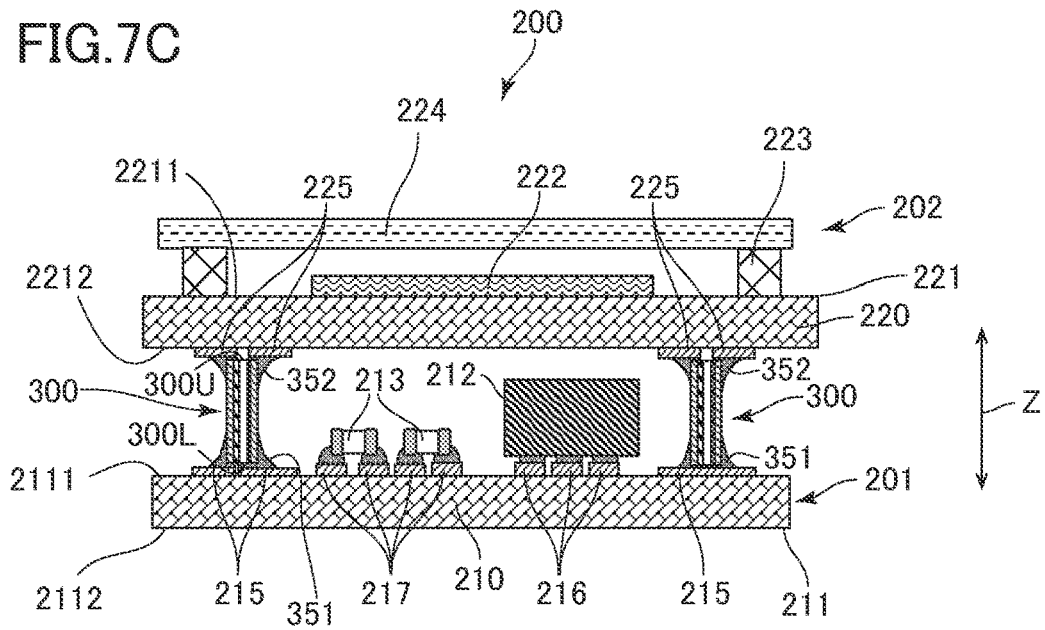
FIG. 7C is an explanatory diagram of the manufacturing method for the image pickup module according to the first embodiment.

Next, in a step illustrated in FIG. 7C, the image sensor 222, the frame 223, and the lid 224 are mounted on the wiring board 221, and thus the circuit unit 202 is manufactured. As a result of this, the image pickup module 200 is manufactured. To be noted, unillustrated pads that bond to the image sensor 222 via wires formed from gold or the like are formed on the wiring board 221 in advance.

The image pickup module 200 can be manufactured through the steps described above. As a result of this, high-density integration on the image pickup module 200 can be made possible. In addition, the image pickup module 200 having a small size can be manufactured with high precision.

Second Embodiment

Figure 8A:
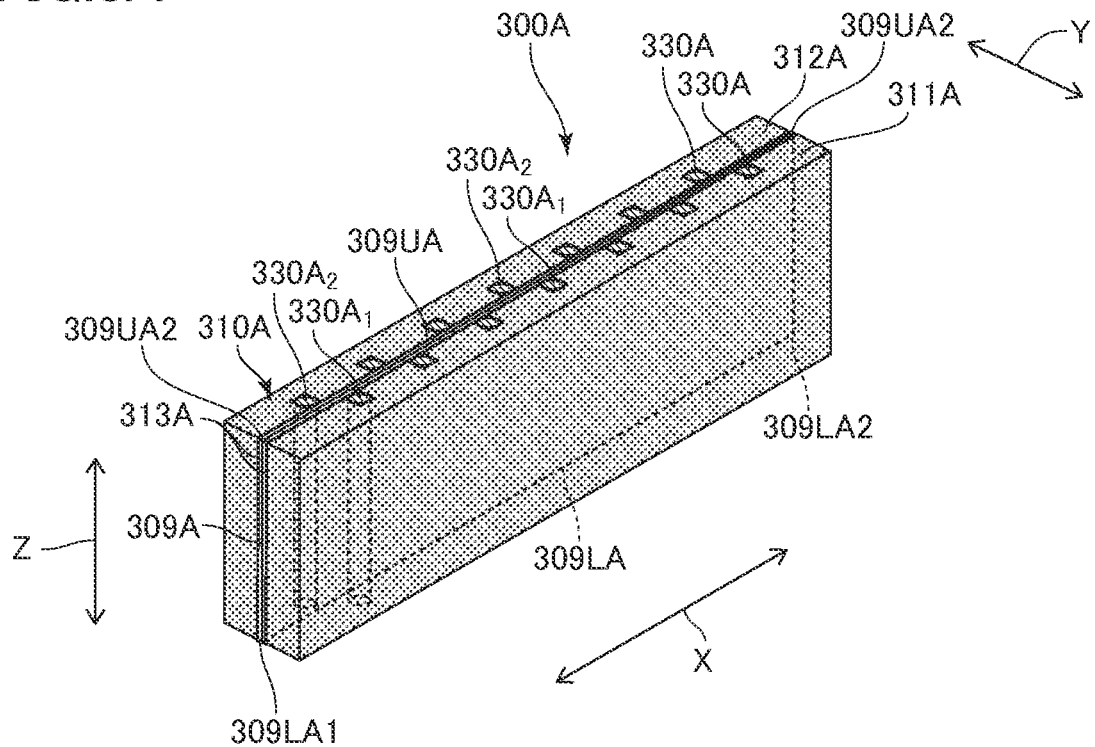
FIG. 8A is a perspective view of an intermediate connection member according to a second embodiment.
Figure 8B:
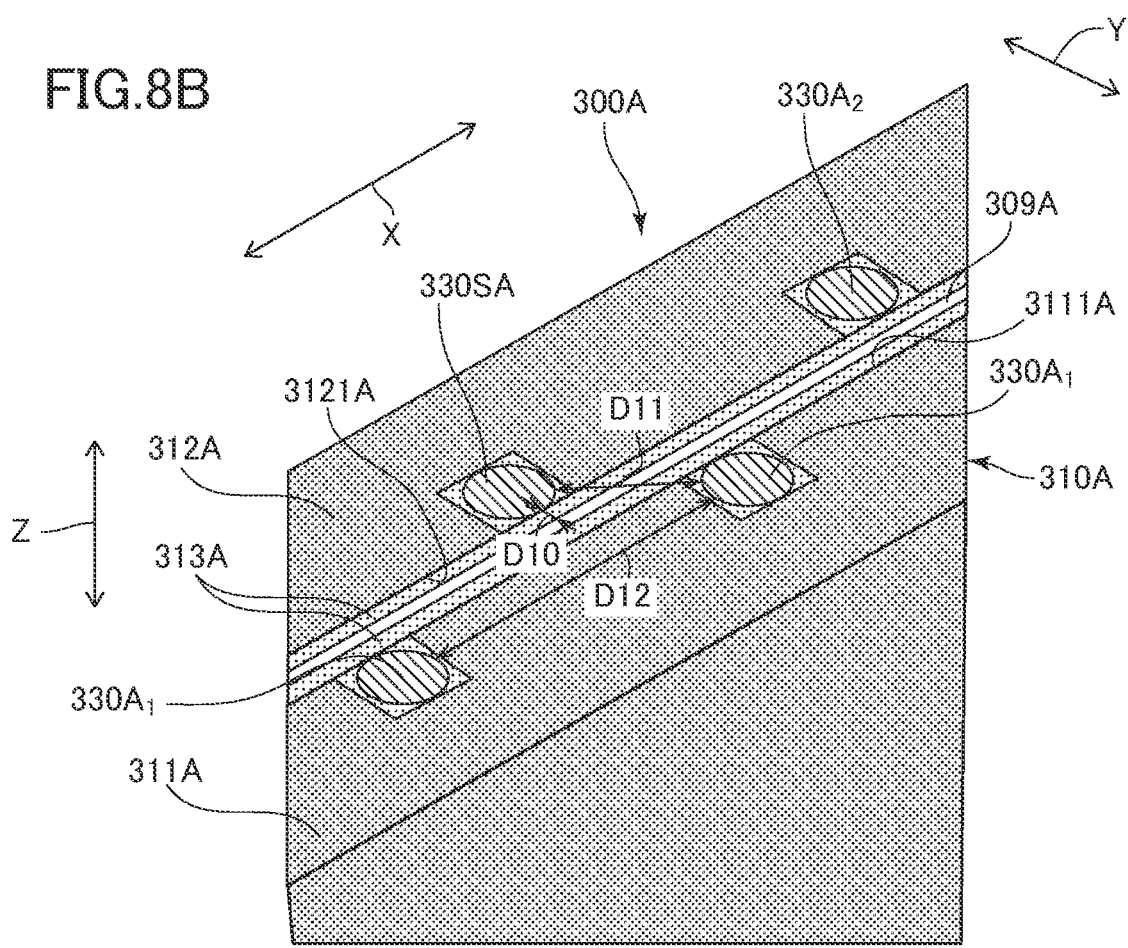
FIG. 8B is a section view of the intermediate connection member according to the second embodiment.

Next, an intermediate connection member according to a second embodiment will be described. FIG. 8A is a perspective view of an intermediate connection member 300A according to the second embodiment. FIG. 8B is an enlarged perspective view of the intermediate connection member 300A. In the electronic module of the second embodiment, the intermediate connection member 300 illustrated in FIG. 2A and the like in the image pickup module 200 of the first embodiment is replaced by an intermediate connection member 300A. In the second embodiment, elements substantially the same as in the first embodiment will be denoted by the same reference signs, and description thereof will be omitted.

The intermediate connection member 300A is, for example, a rigid wiring board having a rectangular parallelepiped shape. Here, the longitudinal direction of the intermediate connection member 300A will be referred to as an X direction, and the width direction of the intermediate connection member 300A will be referred to as a Y direction. The height direction of the intermediate connection member 300A, that is, the short side direction of the intermediate connection member 300A will be referred to as a Z direction. The Z direction is an example of a first direction, the X direction is an example of a second direction, and the Y direction is an example of a third direction. The X direction, the Y direction, and the Z direction intersect each other. In the present embodiment, the X direction, the Y direction, and the Z direction are orthogonal to each other.

The intermediate connection member 300A includes an insulating board 310A that is an example of insulator, a metal layer 309A, and a plurality of wirings 330A each extending in the Z direction. The wirings 330A are each supported by the insulating board 310A. The insulating board 310A includes an insulating substrate 311A that is an example of a first insulating substrate, an insulating substrate 312A that is an example of a second insulating substrate, and an insulating layer 313A interposed between the insulating substrates 311A and 312A. The metal layer 309A is disposed inside the insulating board 310A, that is, between the insulating substrates 311A and 312A in the second embodiment. The plurality of wirings 330A are interposed between the insulating substrates 311A and 312A. The plurality of wirings 330A are arranged in a staggered manner with the metal layer 309A therebetween. The plurality of wirings 330A include a plurality of wirings $330A_1$ disposed on the insulating substrate 311A, and a plurality of wirings $330A_2$ disposed on the insulating substrate 312A. The wirings $330A_1$ are each an example of a first wiring. The wirings $330A_2$ are each an example of a second wiring. The material of each of the insulating substrates 311A and 312A is preferably resin such as epoxy resin containing glass fiber.

The wirings 330A are each electrically connected to a signal wiring, a power supply wiring, or a ground wiring of each of the wiring boards 211 and 221 of FIG. 2B. The insulating substrates 311A and 312A are each an insulating member having a flat plate shape. The insulating substrate 312A is disposed with a distance from the insulating substrate 311A in the Y direction. The plurality of wirings $330A_1$ are arranged at intervals in the X direction. The plurality of wirings $330A_2$ are arranged at intervals in the X direction.

The wirings 330A and the metal layer 309A are each a conductive member including, for example, an inorganic material such as copper, silver, or aluminum, or an organic material such as conductive rubber. The wirings 330A may be each formed by crimping metal foil, or applying a conductive paste by a dispenser or the like and then firing the conductive paste.

The plurality of wirings $330A_1$ is interposed between the insulating substrate 311A and the metal layer 309A, and the plurality of wirings $330A_2$ are interposed between the insulating substrate 312A and the metal layer 309A. The insulating substrate 311A includes a surface 3111A opposing the insulating substrate 312A. The insulating substrate 312A includes a surface 3121A opposing the insulating substrate 311A, that is, the surface 3111A and the surface 3121A oppose each other. The surface 3111A is provided with a plurality of grooves where the plurality of wirings $330A_1$ are disposed. The surface 3121A is provided with a plurality of grooves where the plurality of wirings $330A_2$ are disposed. The metal layer 309A is disposed in the insulating layer 313A between the surfaces 3111A and 3121A. The insulating layer 313A is a cured product of an adhesive or the like, and is formed from a different material from the insulating substrates 311A and 312A.

As described above, the metal layer 309A is interposed between the plurality of wirings $330A_1$ and the plurality of wirings $330A_2$ and between the insulating substrate 311A and the insulating substrate 312A. As a result of this, the metal layer 309A opposes the plurality of wirings $330A_1$ and the plurality of wirings $330A_2$ in the Y direction.

The metal layer 309A extends from one end to the other end of the insulating substrates 311A and 312A in the Z direction. Two end surfaces 309LA and 309UA of the metal layer 309A in the Z direction are exposed to the outside. That is, the end surface 309LA of the metal layer 309A is not covered by the insulating board 310A and is thus exposed from the insulating board 310A, in a region from a first end 309LA1 to a second end 309LA2 in the X direction of the end surface of the intermediate connection member 300A opposing the wiring board 211. In addition, the end surface 309UA of the metal layer 309A is not covered by the insulating board 310A and is thus exposed from the insulating board 310A, in a region from a first end 309UA1 to a second end 309UA2 in the X direction of the end surface of the intermediate connection member 300A opposing the wiring board 221.

The plurality of wirings $330A_1$ and the plurality of wirings $330A_2$ include at least one signal wiring 330SA. In the example of FIG. 8A, the signal wiring 330SA is included in the plurality of wirings $330A_2$. Since the signal wiring 330SA is disposed in the vicinity of the metal layer 309A, the noise in the signal transmitted through the signal wiring 330SA is reduced, and the quality of the transmitted signal is improved.

In the second embodiment, the wirings 330A are each, for example, a wire having a diameter of 0.2 mm. The pitch of the plurality of wirings 330A is, for example, 0.4 mm. The thickness of the metal layer 309A is, for example, 0.02 mm. The thickness of the insulating layer 313A is, for example, 0.02 mm.

A distance D10 in the Y direction between the signal wiring 330SA and the metal layer 309A is preferably equal to or smaller than a distance D11 between two closest wirings among the plurality of wirings $330A_1$ and the plurality of wirings $330A_2$. The two closest wirings among the plurality of wirings $330A_1$ and the plurality of wirings $330A_2$ are, in the second embodiment, one wiring $330A_1$ and one wiring $330A_2$ that are adjacent with the metal layer 309A therebetween. This wiring $330A_2$ is, for example, the signal wiring 330SA. In addition, in the second embodiment, the distance D10 is preferably equal to or smaller than the distance D12 between two adjacent wirings $330A_1$ in the X direction among the plurality of wirings $330A_1$. As described above, as a result of the signal wiring 330SA being disposed near the metal layer 309A, the noise on the signal can be more effectively reduced.

The metal layer 309A is preferably a metal member as a solid pattern, but the configuration is not limited to this. For example, the metal layer 309A may be a metal member having a mesh shape, or a metal member formed by connecting a plurality of metal plates arranged at intervals in the X direction via wires. The metal layer 309A is preferably a continuous metal member.

The image pickup module including the intermediate connection member 300A has less solder bonding failure, and thus can guarantee sufficient optical performance of the image sensor 222. In addition, in the intermediate connection member 300A, the metal layer 309A interposed between the plurality of wirings 330A reduces the noise in the transmitted signal, and thus the quality of the transmitted signal is improved.

Third Embodiment

Figure 9A:
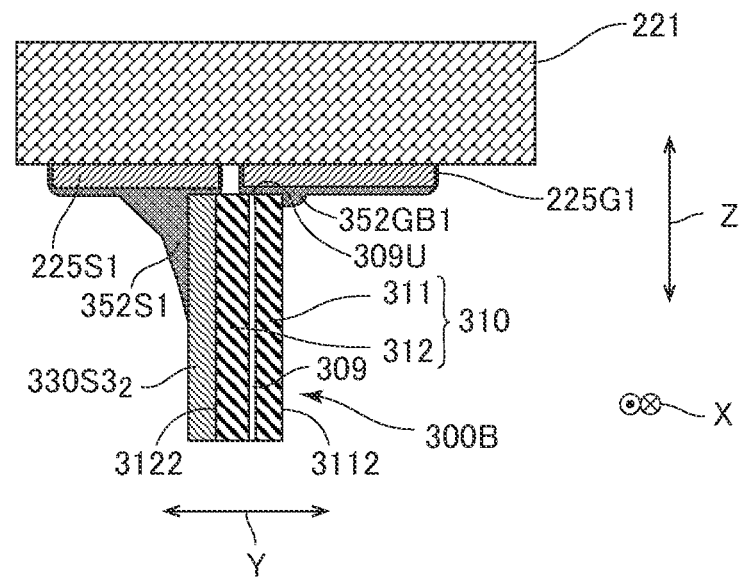
FIG. 9A is an enlarged section view of a connection structure between a wiring board and an intermediate connection member according to a third embodiment.
Figure 9B:
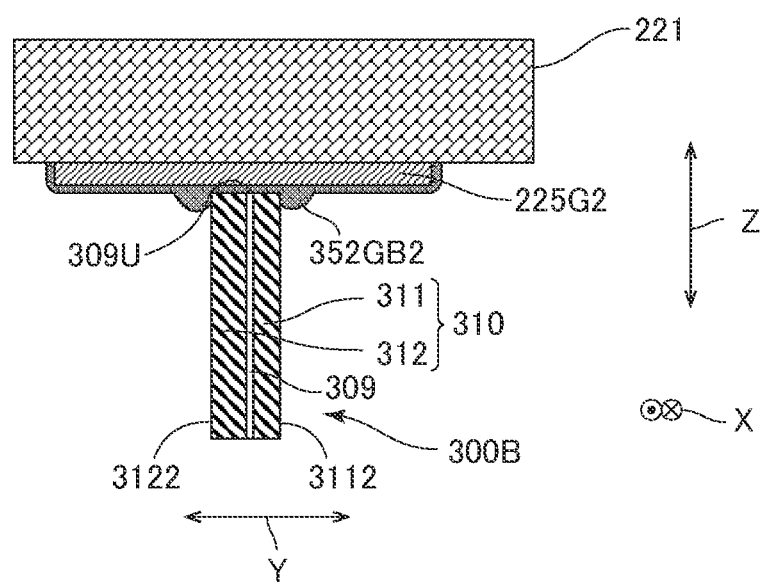
FIG. 9B is an enlarged section view of the connection structure between the wiring board and the intermediate connection member according to the third embodiment.

Next, an intermediate connection member according to a third embodiment will be described. FIGS. 9A and 9B are each an enlarged perspective view of a connection structure between the wiring board 221 and an intermediate connection member 300B according to the third embodiment. FIGS. 9A and 9B each illustrate a cross-section of the connection structure at a different position in the X direction. In the third embodiment, elements substantially the same as in the first embodiment will be denoted by the same reference signs, and description thereof will be omitted.

Although a case where the metal layer 309 is bonded to the ground pads together with the ground wirings has been described in the first embodiment described above, the configuration is not limited to this. In the third embodiment, the connection structure illustrated in FIGS. 5A and 5B described in the first embodiment is replaced by a connection structure illustrated in FIGS. 9A and 9B. The intermediate connection member 300B of the third embodiment includes the insulating board 310 including the insulating substrates 311 and 312, the metal layer 309, and the signal wiring $330S3_2$ similarly to the first embodiment. To be noted, although the illustration thereof is omitted, the intermediate connection member 300B includes a plurality of first wirings disposed on the insulating substrate 311, and a plurality of second wirings disposed on the insulating substrate 312. The plurality of first wirings are arranged at intervals in the X direction, and the plurality of second wirings are arranged at intervals in the X direction. The plurality of first wirings are disposed on the main surface 3112 of the insulating substrate 311 similarly to the first embodiment. The plurality of second wirings are disposed on the main surface 3122 of the insulating substrate 312 similarly to the first embodiment. The signal wiring $330S3_2$ illustrated in FIG. 9A is, for example, one of the plurality of second wirings.

As illustrated in FIG. 9A, the signal wiring $330S3_2$ is bonded to the signal pad 225S1 via the bonding member 352S1. The end surface 309U of the metal layer 309 is bonded to the ground pad 225G1 of the wiring board 221 via a bonding member 352GB1. The ground pad 225G1 is bonded to none of the plurality of first wirings and the plurality of second wirings of the intermediate connection member 300B.

In addition, as illustrated in FIG. 9B, the end surface 309U of the metal layer 309 is bonded to the ground pad 225G2 of the wiring board 221 via a bonding member 352GB2. The ground pad 225G2 is bonded to none of the plurality of first wirings and the plurality of second wirings of the intermediate connection member 300B.

Also in the configuration described above, the noise in the transmitted signal is reduced, and the quality of the transmitted signal is improved. To be noted, the connection structure between the intermediate connection member 300B and the wiring board 211 illustrate in FIG. 2B may be also configured similarly to the connection structure illustrated in FIGS. 9A and 9B.

Example 1

A specific example of the manufacturing method for the image pickup module 200 described in the first embodiment will be described. The thickness of the metal layer 309 in the Y direction was 0.2 mm. The intermediate connection member 300 had a rectangular parallelepiped shape having a length in the X direction of 41.0 mm, a width (thickness) in the Y direction of 1.0 mm, and a height in the Z direction of 1.8 mm. The pitch in the X direction of the plurality of wirings $330_1$ and the pitch in the X direction of the plurality of wirings $330_2$ were both 0.4 mm. The total number of the plurality of wirings 330 was 140. A substrate having a low thermal expansion coefficient was used as the insulating board 310. The outer size of the insulating board 310 was a length in the X direction of 41.0 mm, a height in the Z direction of 1.8 mm, and a thickness in the Y direction of 0.4 mm. The wirings 330 were each a copper wire having a thickness of 0.015 mm and a width of 0.2 mm. The number of the plurality of wirings $330_1$ was 70, and the number of the plurality of wirings $330_2$ was 70. The pitch in the X direction of the wirings 330 was set to 0.4 mm. As the metal layer 309, a copper plate having a length in the X direction of 41.0 mm, a height in the Z direction of 1.8 mm, and a length in the Y direction of 0.2 mm was used. This metal layer 309 was stuck between the insulating substrates 311 and 312 such that the thickness of the intermediate connection member 300 was 1.0 mm. The intermediate connection members 300 having the configuration described above were prepared.

The wiring board 211 illustrated in FIG. 6A was prepared. An unillustrated solder resist partially covering each of the pads 215 to 217 was formed on the main surface 2111 of the wiring board 211. In the solder resist, opening portions are provided at positions respectively corresponding to the pads 215 to 217, and part of each of the pads 215 to 217 is exposed.

FR-4 was used for the insulating substrate 210 of the wiring board 211. The outer size of the wiring board 211 in plan view was 50.0 mm×50.0 mm. In addition, electronic parts such as unillustrated condensers and resistors were mounted in advance on the main surface 2112 of the wiring board 211. The material of each of the pads 215 to 217 of the wiring board 211 was copper. The pads 215 excluding the ground pads 215G1 and 215G2 to which the intermediate connection members 300 were connected each had a width of 0.2 mm and a length of 0.3 mm. The pads 215 were arranged at a pitch of 0.4 mm. The pads 216 and 217 each had a width of 0.2 mm and a length of 0.2 mm. The ground pad 215G1 had a width of 0.2 mm and a length of 0.6 mm. The ground pad 215G2 had a width of 0.2 mm and a length of 1.2 mm.

As illustrated in FIG. 6B, the conductive paste PA was provided on each of the pads 215 to 217 of the wiring board 211 by screen printing. A printing plate having a thickness of 0.02 mm was used for the screen printing. A solder paste containing a solder powder of Sn—Ag—Cu and a flux was used as the conductive paste PA. In addition, the alloy composition of the solder powder contained in the solder paste was Sn-3Ag-0.5Cu, and the melting point of the solder powder was 220° C. The average particle diameter of the solder powder was 40 μm.

A memory 212 to a back surface of which solder balls were connected in advance was prepared. The pads 216 of the wiring board 211 were disposed at positions respectively corresponding to the solder balls of the memory 212. The outer size of the memory 212 was a length of 16.0 mm, a width of 16.0 mm, and a height of 1.6 mm. In addition, four intermediate connection members 300 were prepared.

As illustrated in FIG. 6C, the memory 212, the electronic parts 213, and the intermediate connection members 300 were placed on the wiring board 211, onto which the conductive paste PA was supplied, by using a mounter. The four intermediate connection members 300 were placed on the wiring board 211 so as to surround the memory 212 and the electronic parts 213.

The end surface 330L of each of the wirings 330 and each of the pads 215 of the wiring board 211 were aligned for each of the four intermediate connection members 300, and the intermediate connection members 300 were each placed on the wiring board 211. In addition, unillustrated solder balls of the memory 212 and the pads 216 of the wiring board 211 were aligned, and the memory 212 was placed on the wiring board 211. The width of the insulating board 310 of each of the intermediate connection members 300 was 1.0 mm, and the intermediate connection members 300 stood upright on the wiring board 211.

Next, the wiring board 211 on which these parts were placed was put into the reflow furnace, and the conductive paste PA was heated to a temperature equal to or higher than the melting point of the solder powder. After the solder powder melted and the molten solder aggregated, the molten solder was cooled to a temperature lower than the melting point of solder, and thus the molten solder was solidified. As a result of this, the memory 212, the electronic parts 213, and the intermediate connection members 300 were bonded to the wiring board 211 as illustrated in FIG. 6D.

Next, as illustrated in FIG. 7A, the conductive paste PB was provided on each of the pads 225 of the wiring board 221 by screen printing. A solder paste containing a solder powder of Sn—Ag—Cu and a flux was used as the conductive paste PB. In addition, the alloy composition of the solder powder contained in the solder paste was Sn-3Ag-0.5Cu, and the melting point of the solder powder was 220° C. The average particle diameter of the solder powder was 40 μm.

Next, each of the pads 225 of the wiring board 221 onto which the conductive paste PB was supplied and the end surface 330U of each of the wirings 330 of the intermediate connection member 300 were aligned, and the wiring board 221 was placed on the four intermediate connection members 300. An unillustrated solder resist partially covering each of the pads 225 was formed on the main surface 2212 of the wiring board 221. The solder resist was provided with opening portions at positions respectively corresponding to the pads 225, and part of each of the pads 225 was exposed.

An insulating substrate having a low thermal expansion coefficient was used for the insulating substrate 220 of the wiring board 221. The outer size of the wiring board 221 in plan view was 52.0 mm×52.0 mm. The material of each of the pads 225 of the wiring board 221 was copper. The pads 225 to which the intermediate connection members 300 were connected each had a width of 0.2 mm and a length of 0.3 mm, and were arranged at a pitch of 0.4 mm.

Next, as illustrated in FIG. 7B, a mounted product in which the wiring board 221 was mounted on the intermediate connection members 300 was put into the reflow furnace, and the conductive paste PB was heated to a temperature equal to or higher than the melting point of the solder powder. After the solder powder melted and the molten solder aggregated, the molten solder was cooled to a temperature lower than the melting point of solder, and thus the molten solder was solidified. As a result of this, the wiring board 221 was bonded to the intermediate connection members 300.

Next, as illustrated in FIG. 7C, the image sensor 222, the frame 223, and the lid 224 was mounted on the wiring board 221 to manufacture the circuit unit 202, and thus the image pickup module 200 was obtained. The image pickup module 200 manufactured by the process described above had less solder bonding failure, and thus could guarantee sufficient optical performance of the image sensor 222. In addition, the metal layer 309 of the intermediate connection member 300 reduced the noise in the transmitted signal, and thus the quality of the transmitted signal was improved.

As described above, according to the present disclosure, the noise can be reduced in the intermediate connection members.

The present invention is not limited to the embodiments described above, and can be modified in many ways within the technical concept of the present disclosure. In addition, the effects described in the embodiments are merely enumeration of the most preferable effects that can be obtained from the present invention, and the effects of the present invention are not limited to those described in the embodiments.

Although a case where the electronic device is a digital camera has been described as an example in the embodiments described above, the configuration is not limited to this. For example, the electronic device may be a mobile communication device. For example, the electronic device may be an information device such as a smartphone or a personal computer, or a communication device such as a modem or a router. Alternatively, the electronic device may be an office appliance such as a printer or a copier, a medical device such as a radiation imaging device, a magnetic imaging device, an ultrasonic imaging device, or an endoscope, an industrial device such as a robot or a semiconductor manufacturing device, or a transport device such as a vehicle, an airplane, or a ship. In the case of providing the wiring in a limited space in the casing of the electronic device, the miniaturization or high-density integration of the electronic device can be made possible by using the intermediate connection members 300. The electronic module of the present disclosure can be applied to various electronic devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-3467, filed Jan. 13, 2022, which is hereby incorporated by reference herein in its entirety.

What is claimed is:
1. An electronic module comprising:
a first wiring board;
a second wiring board disposed with a gap from the first wiring board in a first direction; and an intermediate connection member interposed between the first wiring board and the second wiring board, wherein the intermediate connection member includes:
   an insulator;
   a plurality of first wirings supported by the insulator and arranged at intervals in a second direction intersecting the first direction;
   a plurality of second wirings supported by the insulator and arranged at intervals in the second direction; and
   a metal layer supported by the insulator and interposed between the plurality of first wirings and the plurality of second wirings so as to oppose the plurality of first wirings and the plurality of second wirings in a third direction intersecting the first direction and the second direction, and
a part of the metal layer sandwiched in the insulator is bonded to one of the first wiring board or the second wiring board by a conductive first bonding member.

2. The electronic module according to claim 1,
wherein the plurality of first wirings and the plurality of second wirings include a signal wiring bonded to the one of the first wiring board or the second wiring board by a conductive second bonding member and used for signal transmission, and
the conductive second bonding member overlaps the metal layer as viewed in the third direction.

3. The electronic module according to claim 1,
wherein the plurality of first wirings and the plurality of second wirings include a signal wiring bonded to the one of the first wiring board or the second wiring board by a conductive second bonding member and used for signal transmission, and
a distance between the signal wiring and the metal layer is equal to or smaller than a distance between two closest wirings among the plurality of first wirings and the plurality of second wirings.

4. The electronic module according to claim 2, wherein a distance between the signal wiring and the metal layer is equal to or smaller than a distance between two adjacent ones of the plurality of first wirings.

5. The electronic module according to claim 1,
wherein the first wiring board includes a first ground including a first ground pad, and
the metal layer is bonded to the first ground pad so as to be electrically connected to the first ground.

6. The electronic module according to claim 5, wherein the plurality of first wirings include a first ground wiring bonded to the first ground pad.

7. The electronic module according to claim 5, wherein the plurality of second wirings include a second ground wiring bonded to the first ground pad.

8. The electronic module according to claim 1,
wherein the second wiring board includes a second ground including a second ground pad, and
the metal layer is bonded to the second ground pad so as to be electrically connected to the second ground.

9. The electronic module according to claim 8, wherein the plurality of first wirings include a third ground wiring bonded to the second ground pad.

10. The electronic module according to claim 8, wherein the plurality of second wirings include a fourth ground wiring bonded to the second ground pad.

11. The electronic module according to claim 1,
wherein the insulator includes a first insulating substrate and a second insulating substrate,
the metal layer is interposed between the first insulating substrate and the second insulating substrate in the third direction,
the first insulating substrate is interposed between the first wirings and the metal layer, and
the second insulating substrate is interposed between the second wirings and the metal layer.

12. The electronic module according to claim 1,
wherein the insulator includes a first insulating substrate and a second insulating substrate,
the metal layer is interposed between the first insulating substrate and the second insulating substrate in the third direction,
the plurality of first wirings are interposed between the first insulating substrate and the metal layer, and
the plurality of second wirings are interposed between the second insulating substrate and the metal layer.

13. The electronic module according to claim 1, further comprising:
a first semiconductor element mounted on the first wiring board; and
a second semiconductor element mounted on the second wiring board.

14. The electronic module according to claim 13, the first semiconductor element is mounted on a surface of the first wiring board opposing the second wiring board.

15. The electronic module according to claim 13, wherein the second semiconductor element is mounted on a surface on a back side of a surface of the second wiring board opposing the first wiring board.

16. The electronic module according to claim 13, wherein the second semiconductor element is an image sensor.

17. The electronic module according to claim 13, wherein the first semiconductor element is a memory.

18. An electronic module comprising:
a first wiring board;
a second wiring board disposed with a gap from the first wiring board in a first direction; and
an intermediate connection member interposed between the first wiring board and the second wiring board,
wherein the intermediate connection member includes:
   an insulator;
   a plurality of first wirings supported by the insulator and arranged at intervals in a second direction intersecting the first direction;
   a plurality of second wirings supported by the insulator and arranged at intervals in the second direction; and
   a metal layer supported by the insulator and interposed between the plurality of first wirings and the plurality of second wirings so as to oppose the plurality of first wirings and the plurality of second wirings in a third direction intersecting the first direction and the second direction,
the plurality of first wirings and the plurality of second wirings include a signal wiring used for signal transmission, and
a distance between the signal wiring and the metal layer is equal to or smaller than a distance between two closest wirings in the plurality of first wirings and the plurality of second wirings.

19. An intermediate connection member interposed between a first wiring board and a second wiring board such that the first wiring board and the second wiring board are spaced apart from each other in a first direction, the intermediate connection member comprising:
an insulator;

a plurality of first wirings supported by the insulator and arranged at intervals in a second direction intersecting the first direction;
a plurality of second wirings supported by the insulator and arranged at intervals in the second direction; and
a metal layer supported by the insulator and interposed between the plurality of first wirings and the plurality of second wirings so as to oppose the plurality of first wirings and the plurality of second wirings in a third direction intersecting the first direction and the second direction,
wherein the metal layer has an end surface exposed from the insulator in a surface of the intermediate connection member opposing one of the first wiring board or the second wiring board.

20. An electronic device comprising:
a casing; and
the electronic module according to claim 1 disposed in the casing.

* * * * *